United States Patent [19]

Herlein

[11] Patent Number: 4,635,256
[45] Date of Patent: Jan. 6, 1987

[54] FORMATTER FOR HIGH SPEED TEST SYSTEM

[75] Inventor: Richard F. Herlein, San Jose, Calif.

[73] Assignee: Fairchild Semiconductor Corporation, Cupertino, Calif.

[21] Appl. No.: 611,446

[22] Filed: May 17, 1984

Related U.S. Application Data

[63] Continuation-in-part of Ser. No. 518,499, Aug. 1, 1983, abandoned.

[51] Int. Cl.$^4$ ............................................. G01R 31/28
[52] U.S. Cl. ........................................... 371/1; 371/20
[58] Field of Search ................................. 371/1, 20, 25; 324/73 R, 73 AT

[56] References Cited

U.S. PATENT DOCUMENTS 4,488,297 12/1984 Vaid ........................................ 371/1
4,497,056 1/1985 Sugamori ............................. 371/25
4,523,312 6/1985 Takeuchi ................................ 371/1

Primary Examiner—Charles E. Atkinson
Attorney, Agent, or Firm—Theodore S. Park; Bruce D. Riter; Robert C. Colwell

[57] ABSTRACT

A formatting circuit for a high speed integrated circuit test system controls the application of timed data pulses to the input terminals of the device being tested, generates strobe signals to control comparators connected to the output terminals of the device being tested, and provides circuitry to decode error signals received from the device being tested. The formatting circuit routes all critical signal paths to the device under test over separate signal lines, thereby allowing compensation for the different propagation delay of each signal path. The input transitions and output strobe signals for the device being tested are not fixed in time with respect to the system clock, but are referenced to it. This enables drive data cycles and compare data cycles to be less dependent on the system clock, and permits them to overlap and cross test period boundaries. Multiple test vectors for a given test period are permitted and error correlator decodes error signals produced by incorrect output signals from the device under test. The error correlator decodes these error signals and logs them in a memory location corresponding to the proper test vector.

12 Claims, 20 Drawing Figures

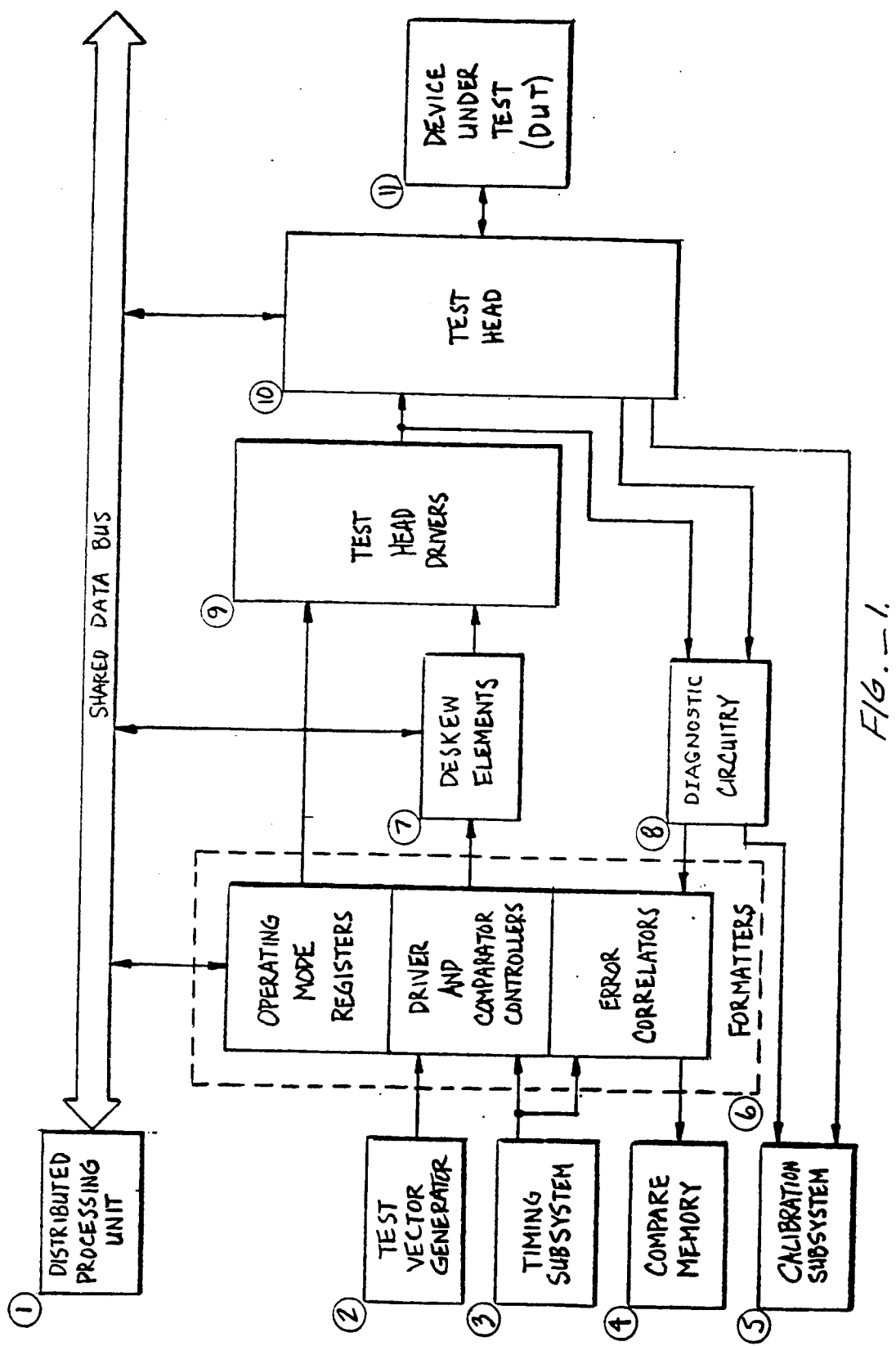
FIG._1.

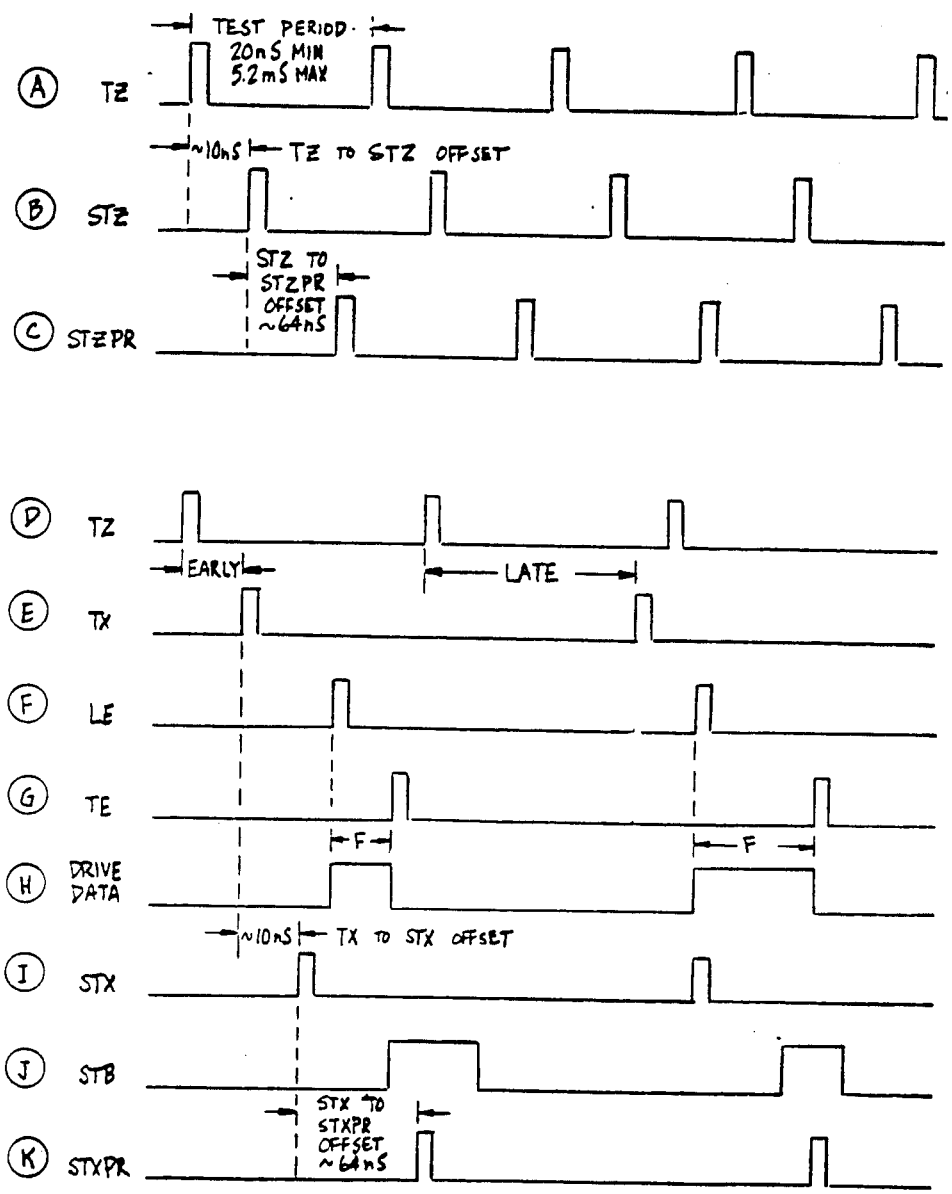
FIG_2

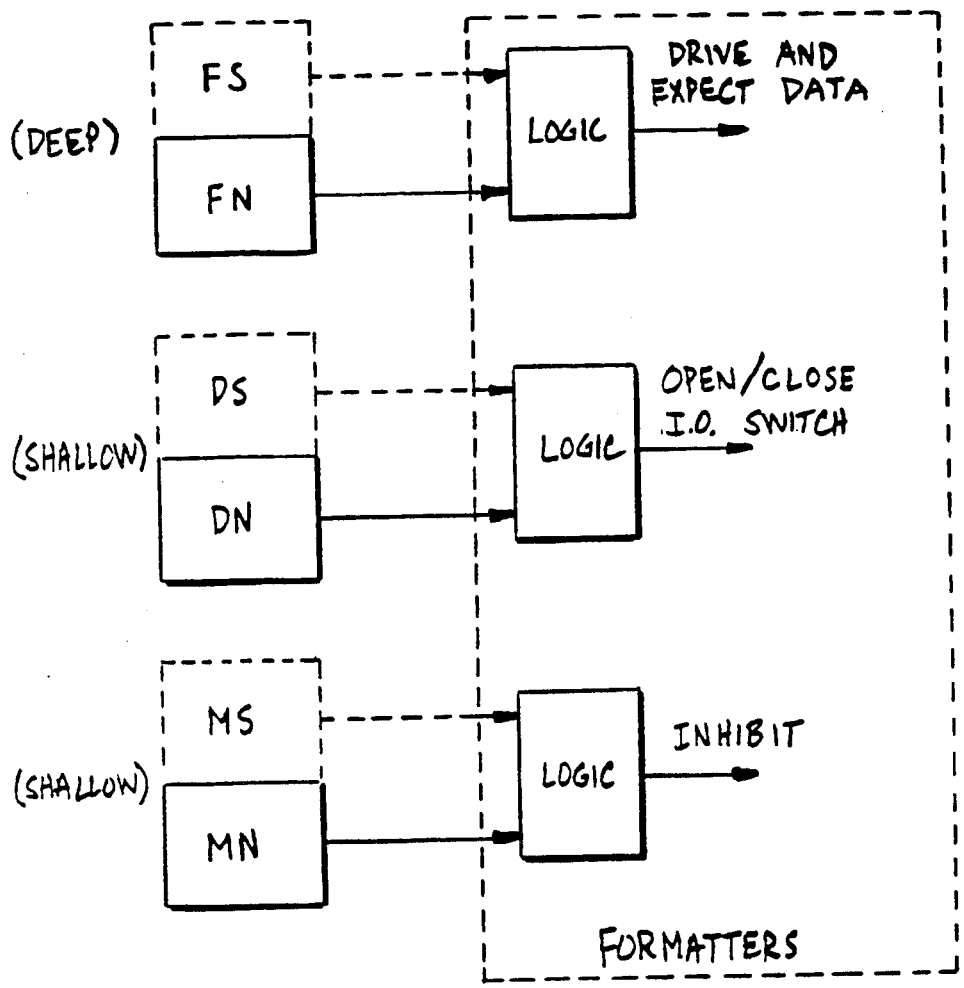
FIG._3.

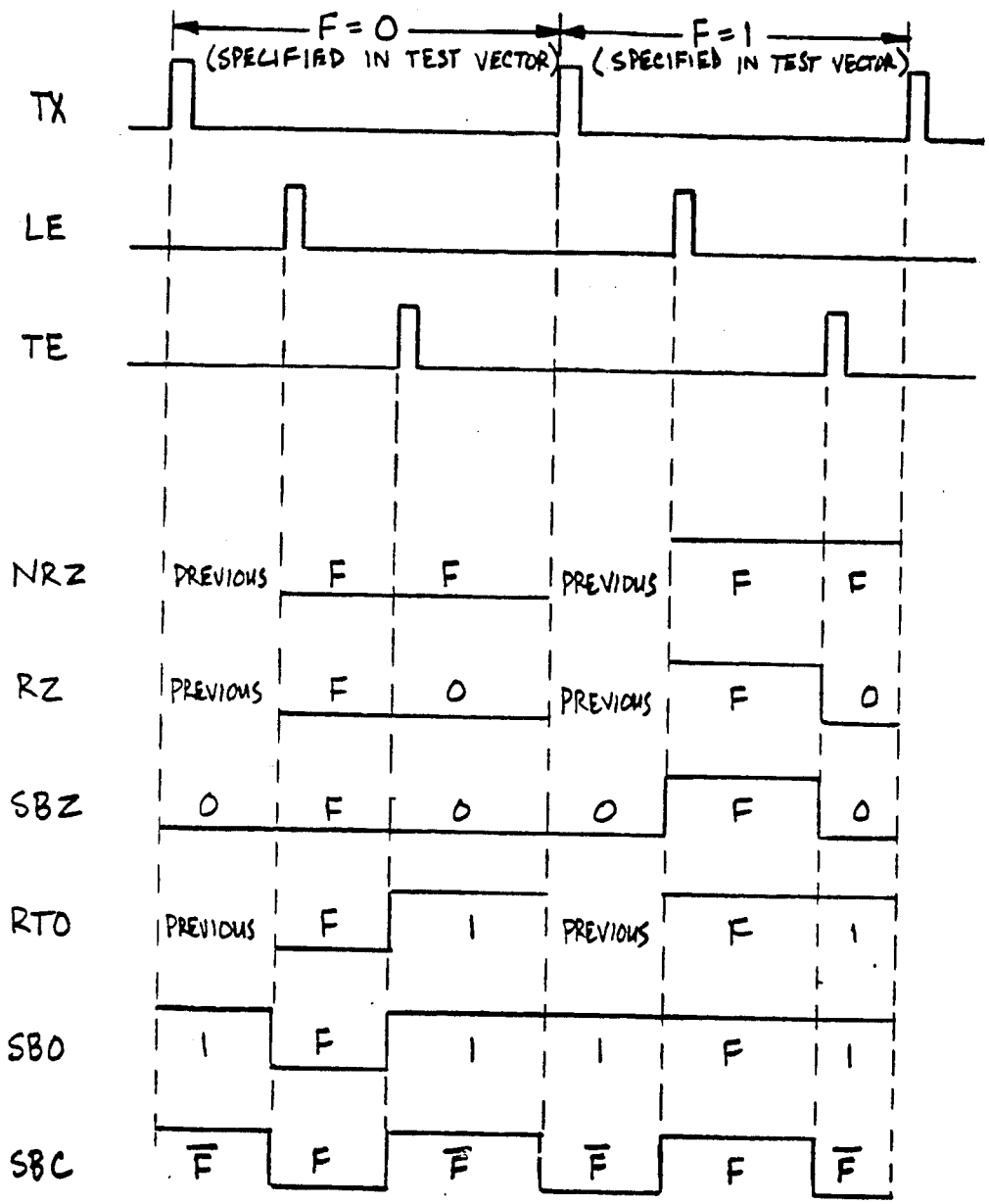
FIG._4.

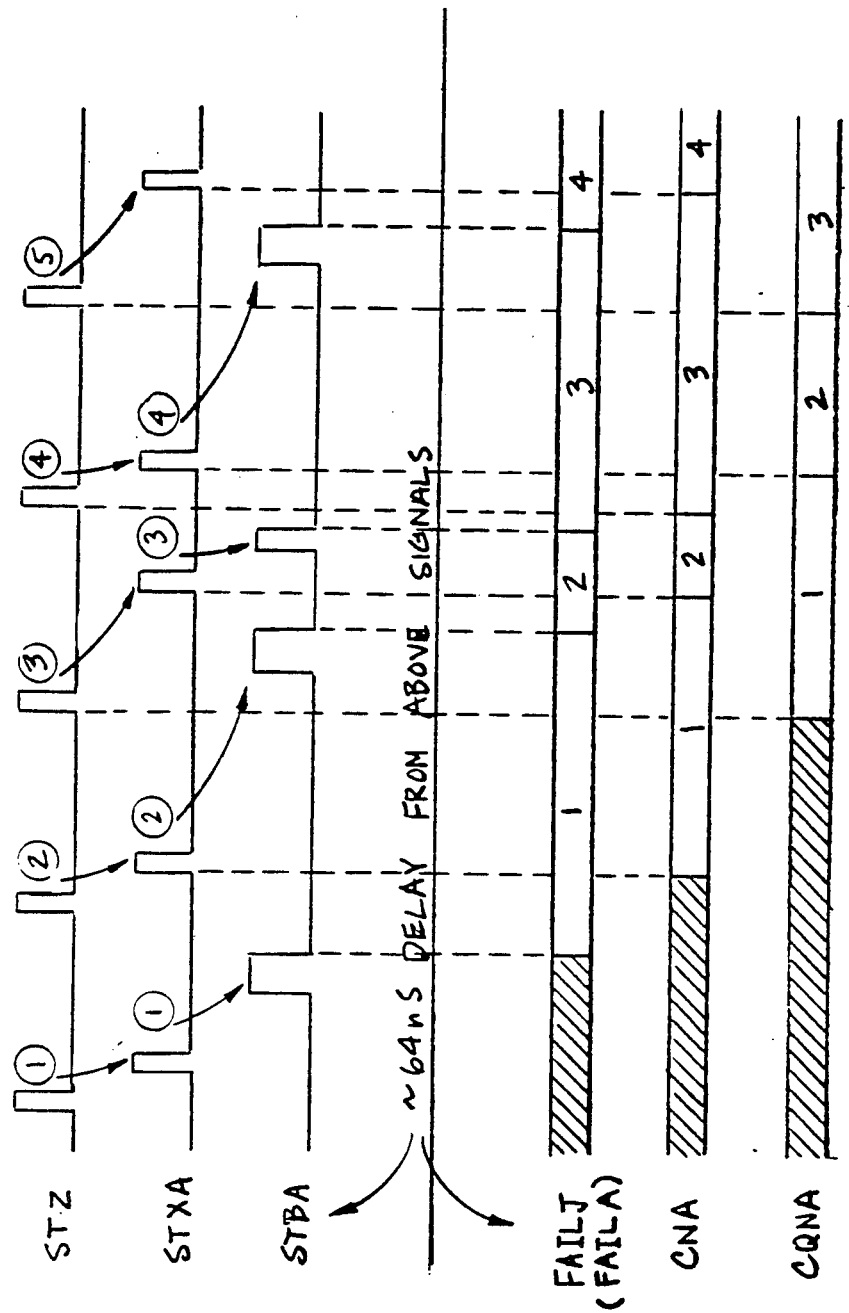
FIG.—5.

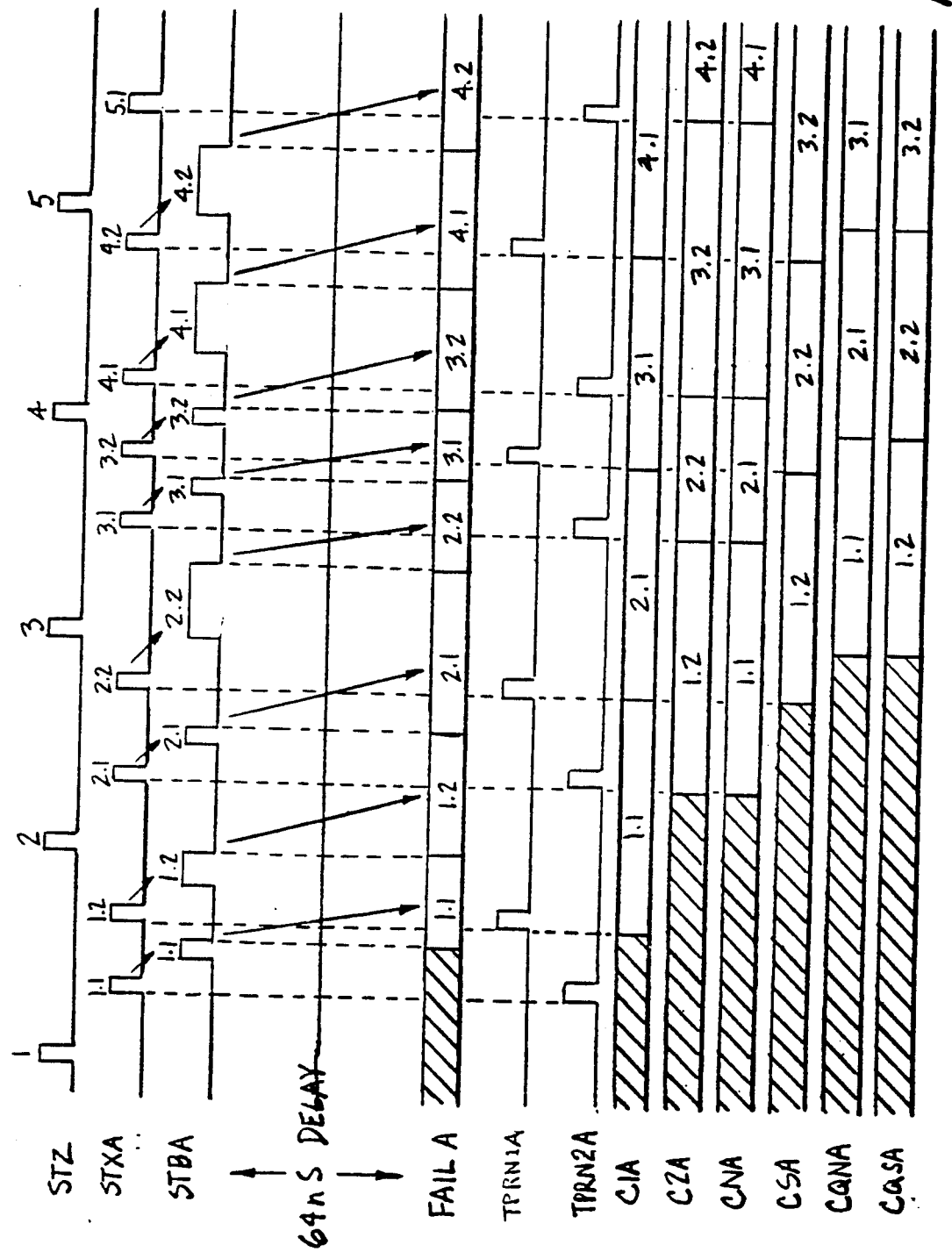
FIG._6.

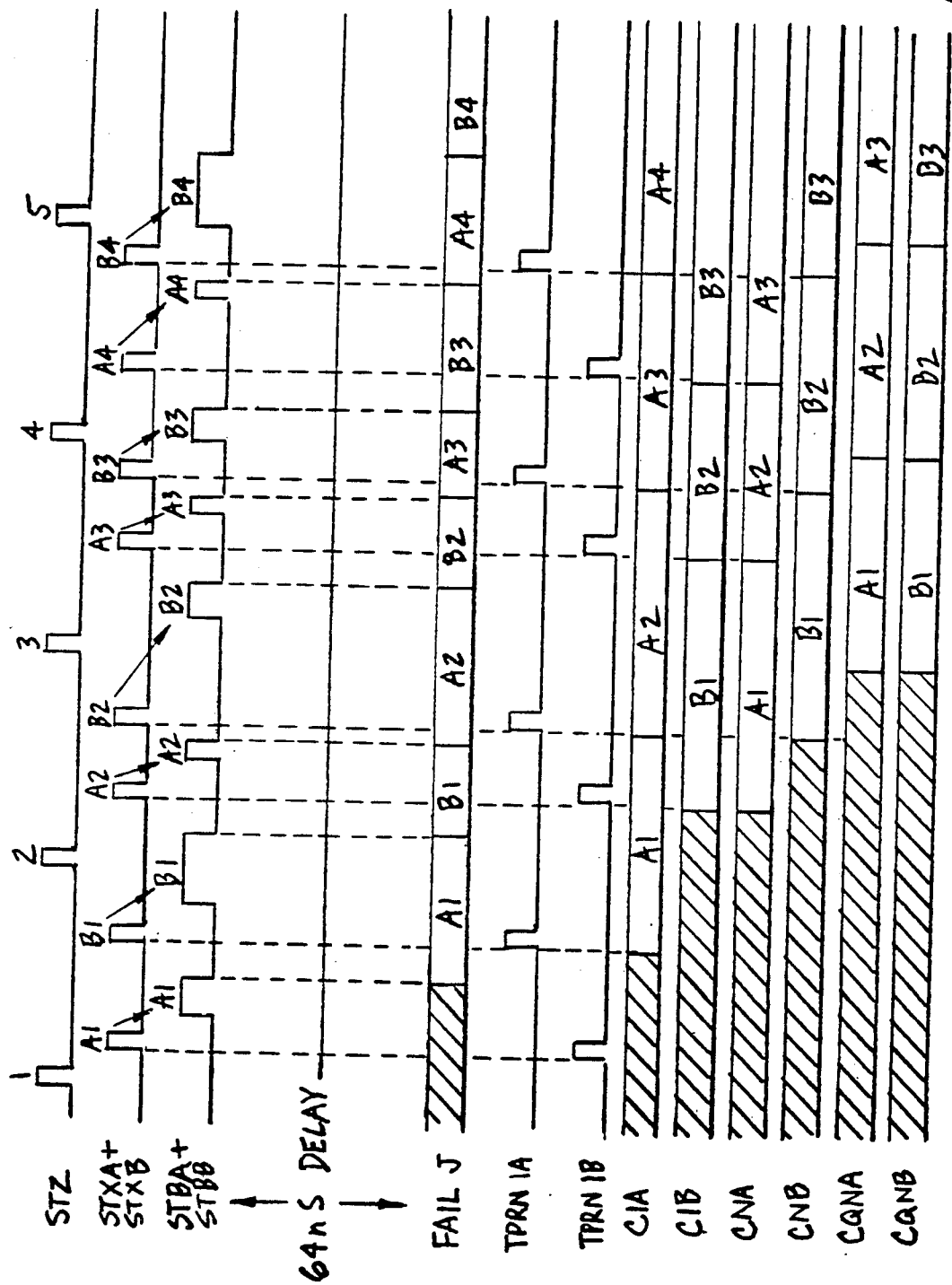
FIG._7.

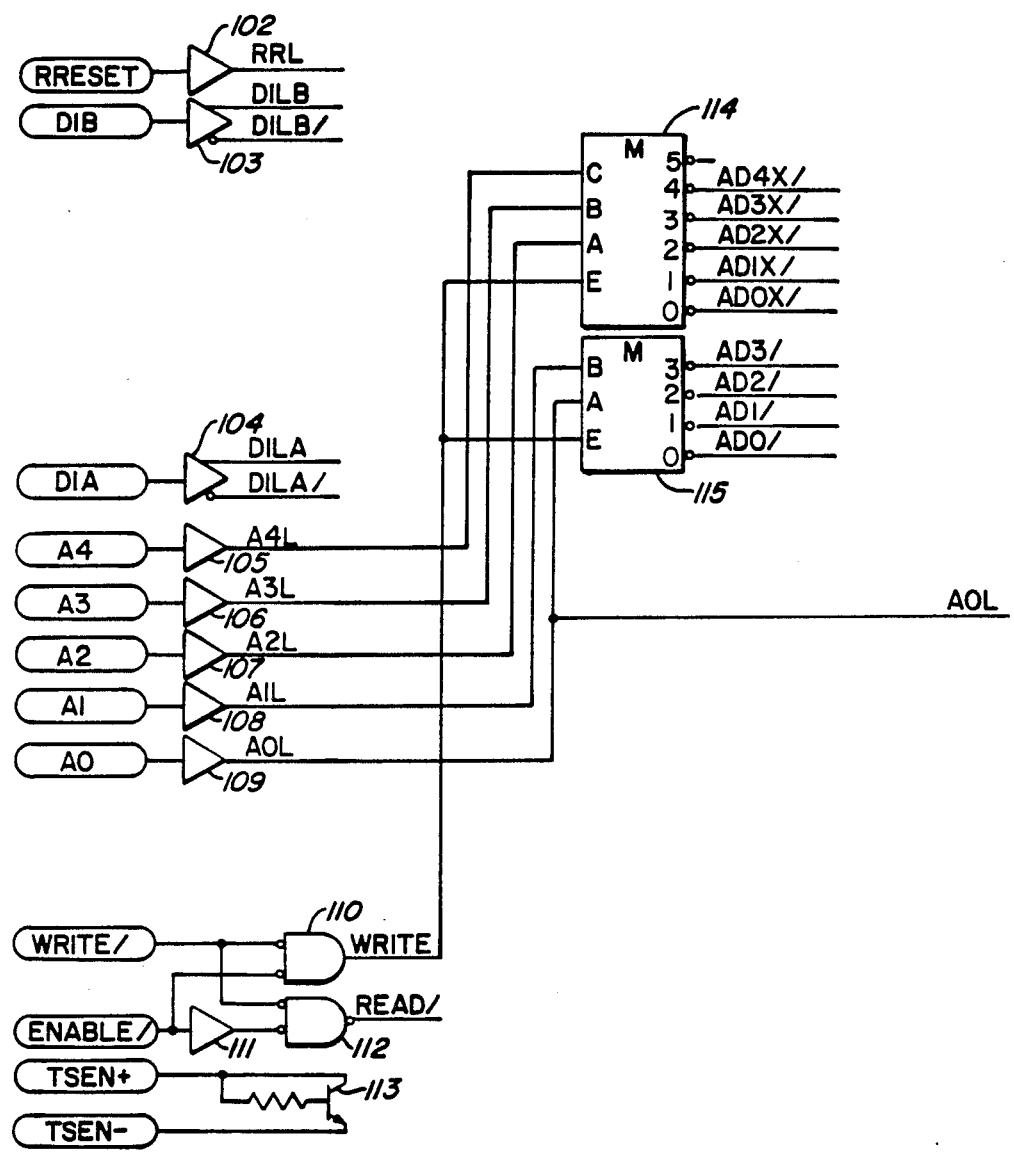
FIG._8A.

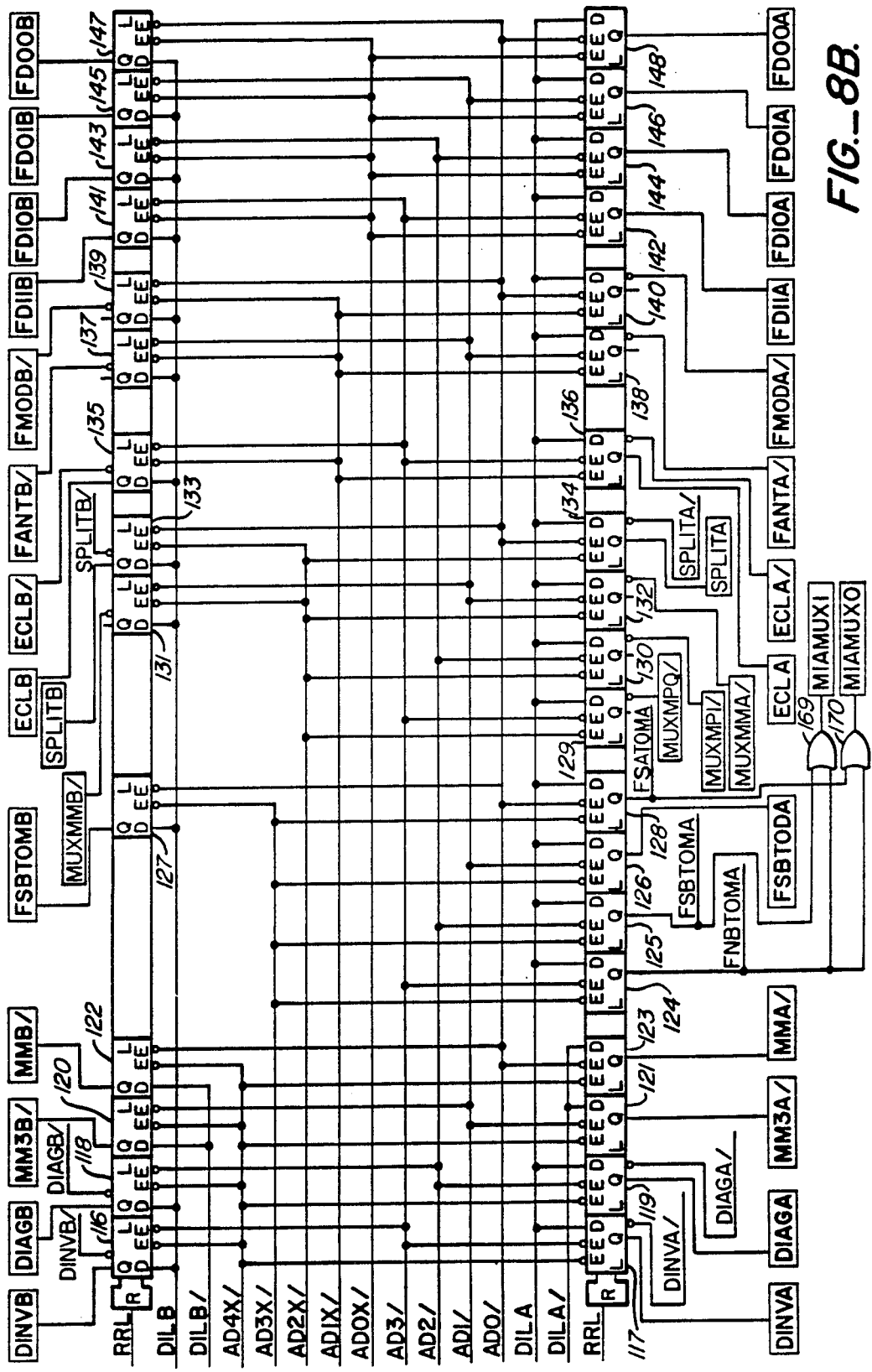
FIG._8B.

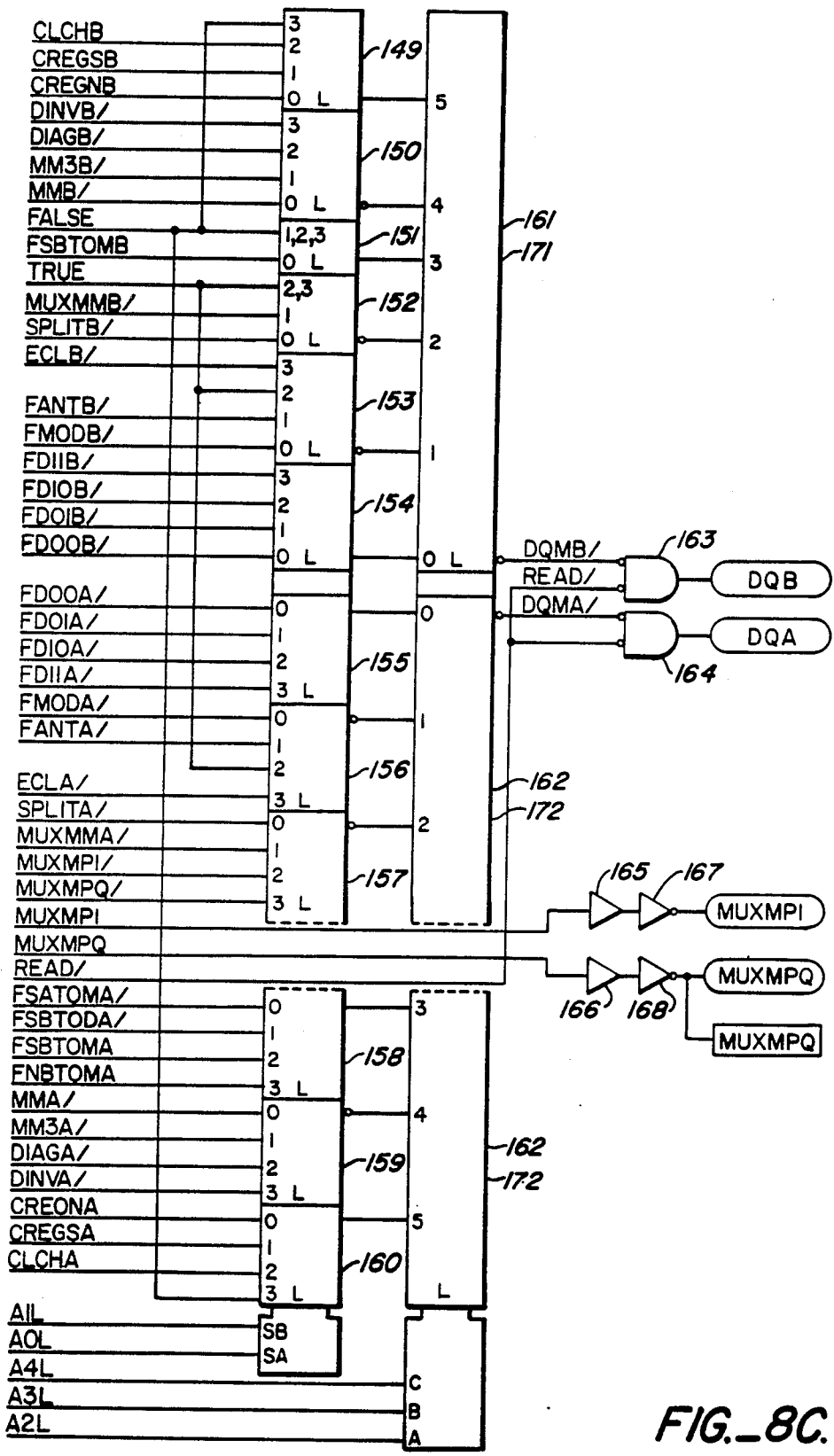
FIG._8C.

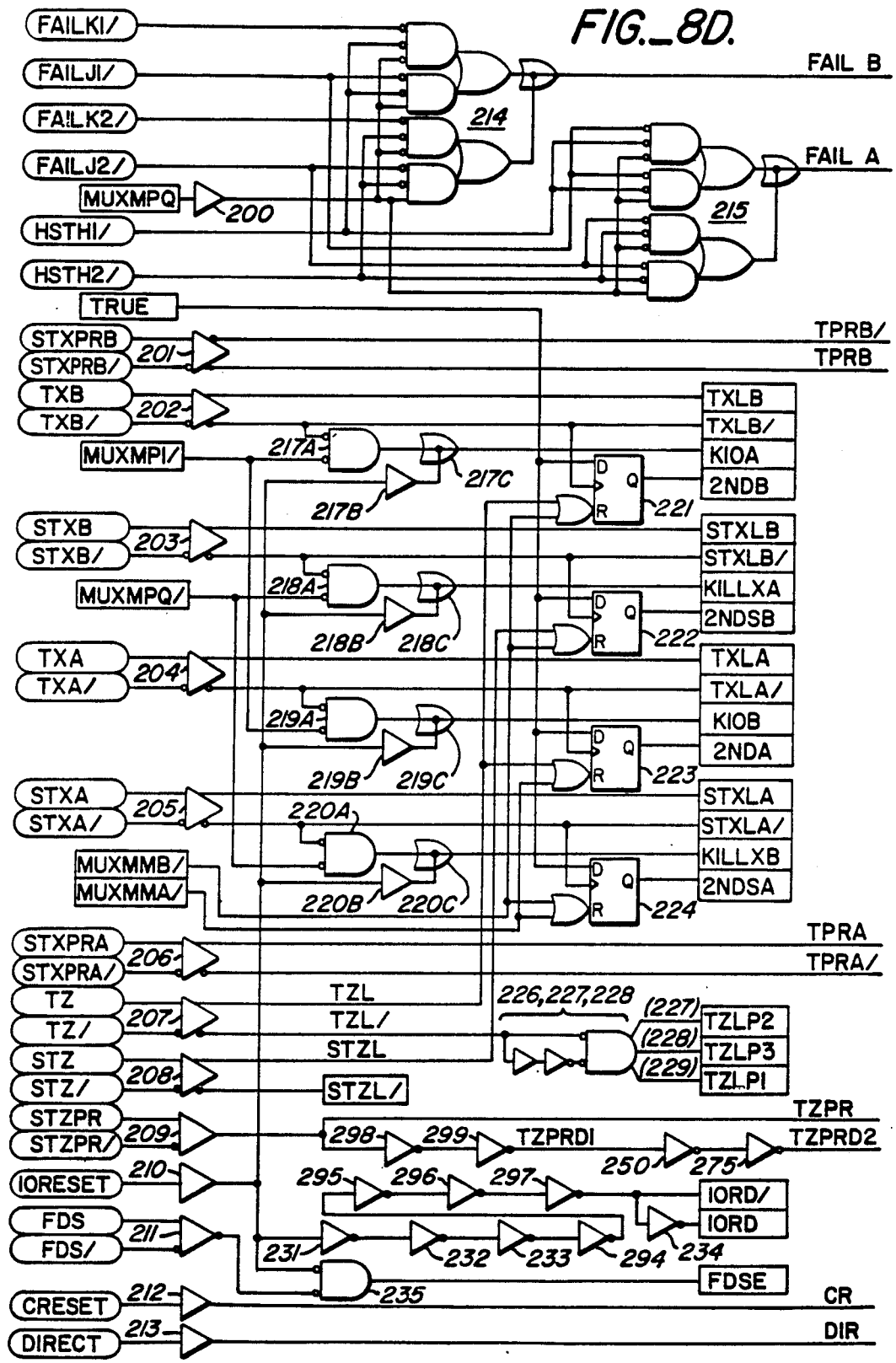
FIG._8D.

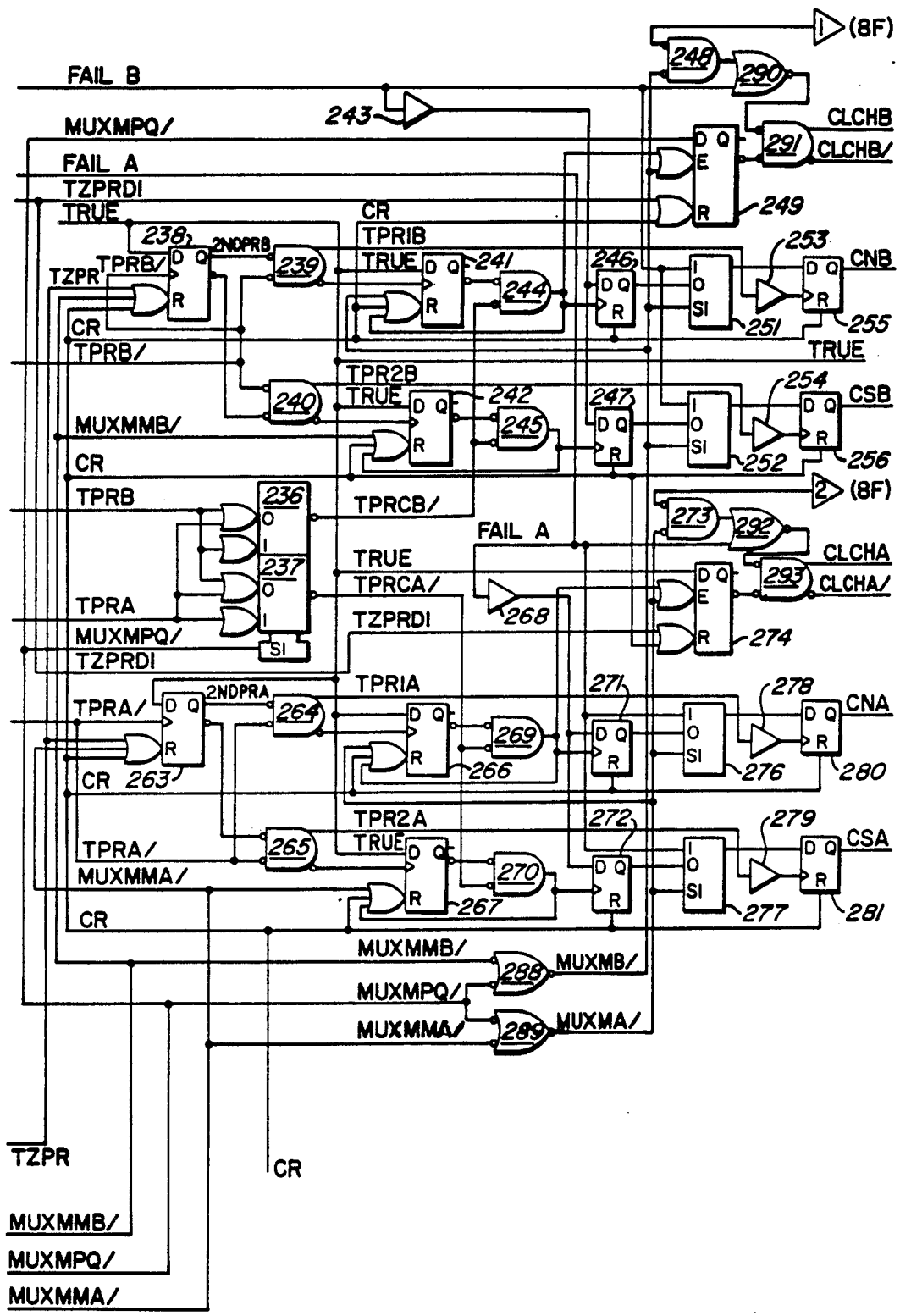
FIG._8E.

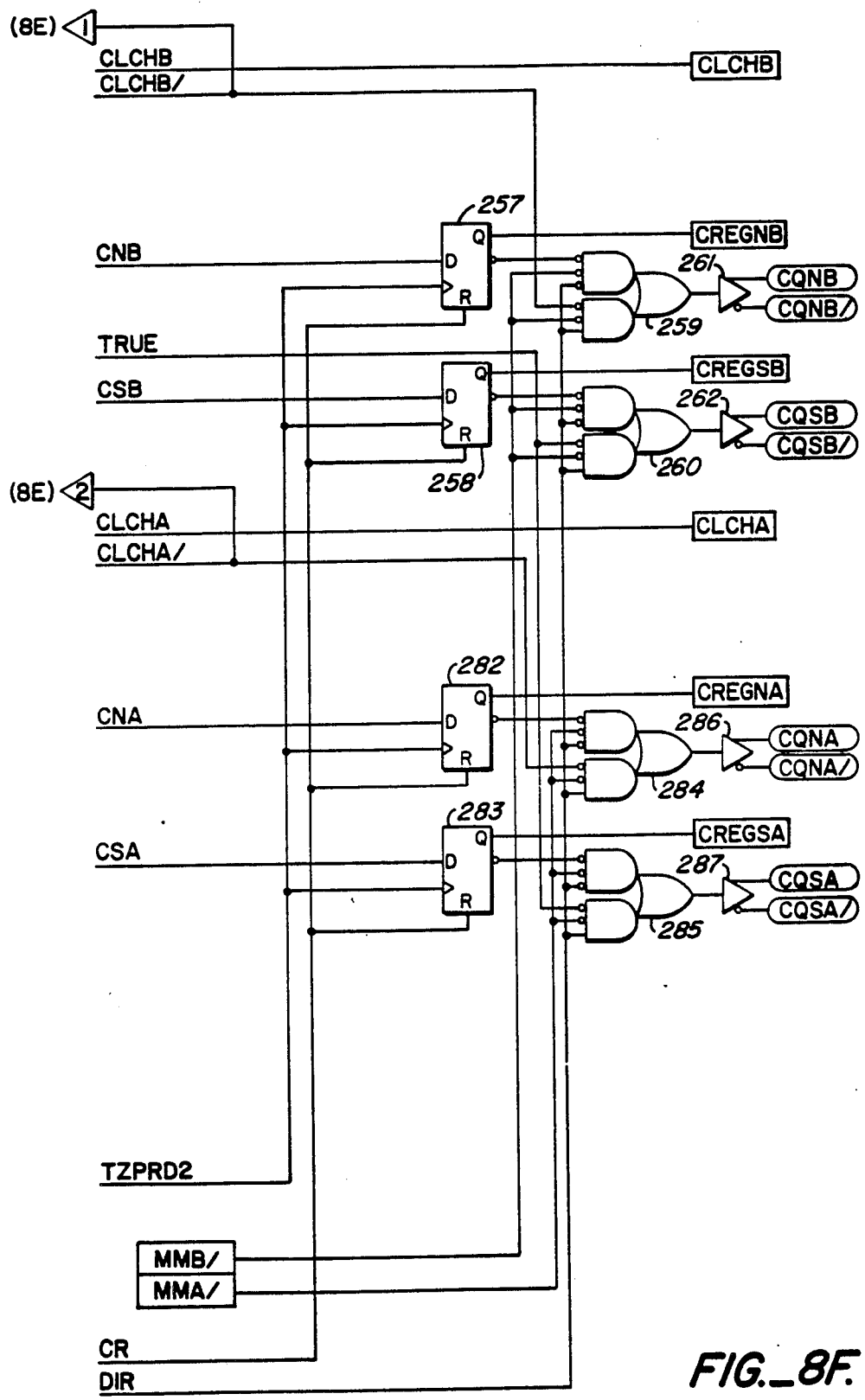
FIG._8F.

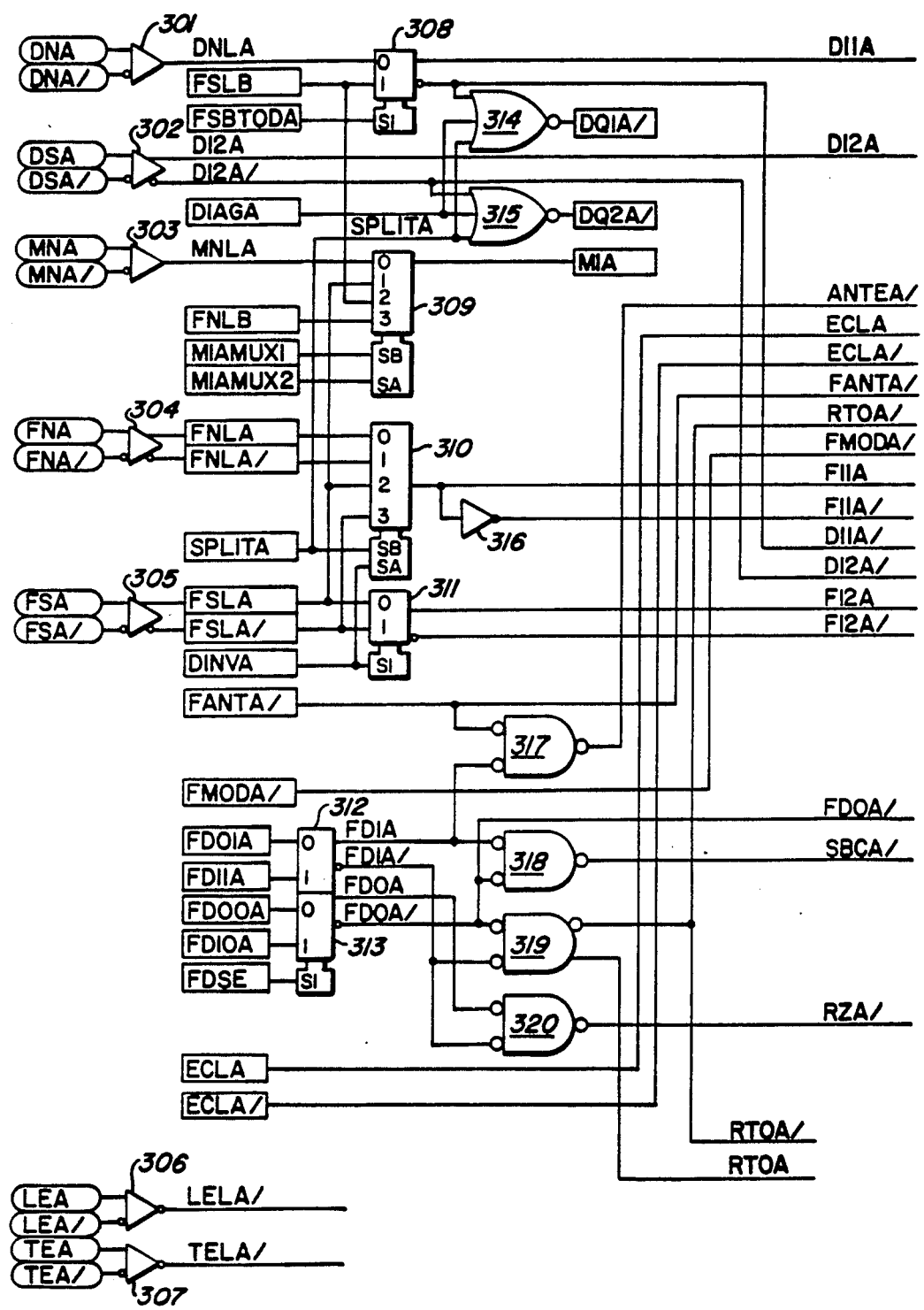
FIG._8G.

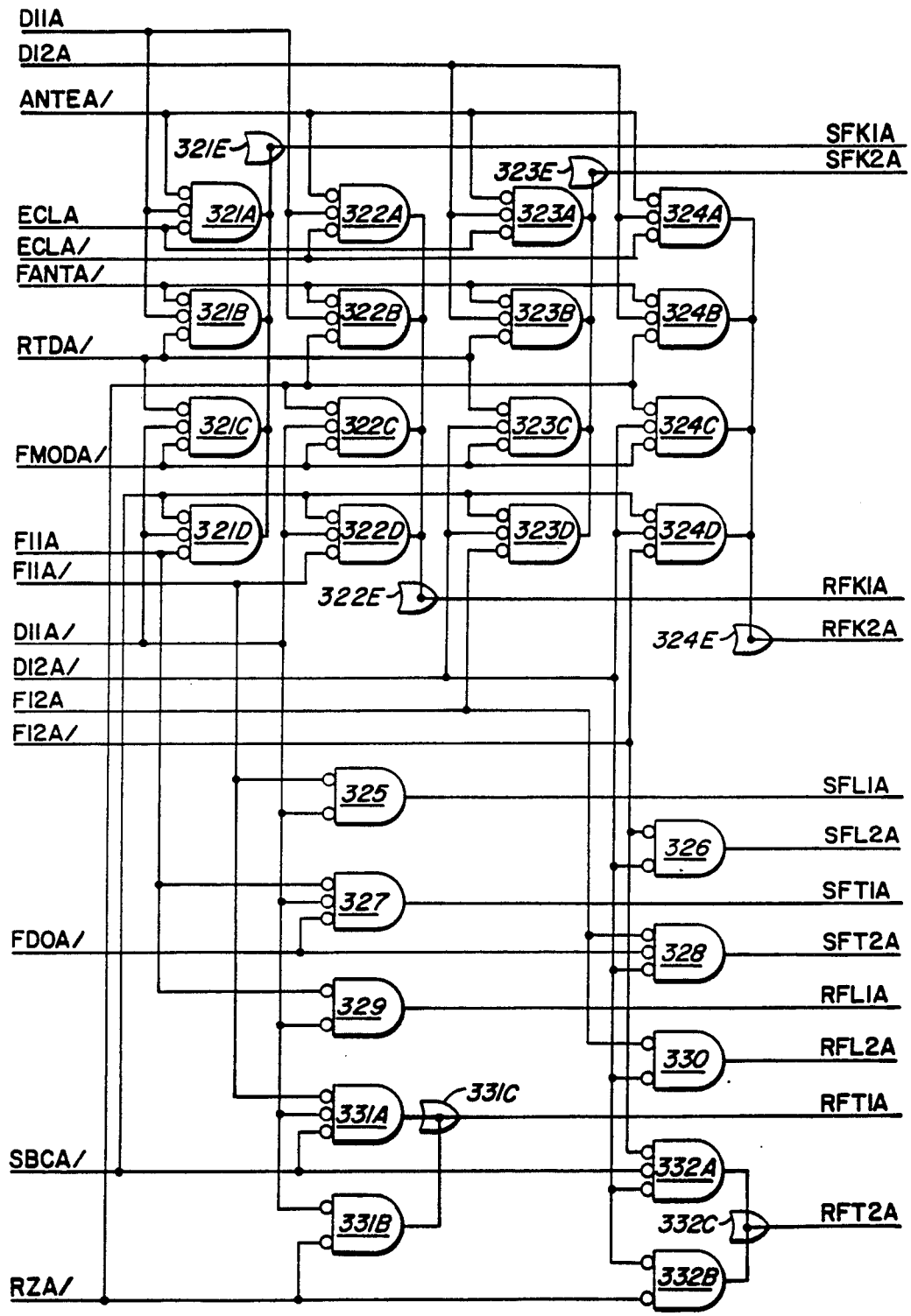
FIG._8H.

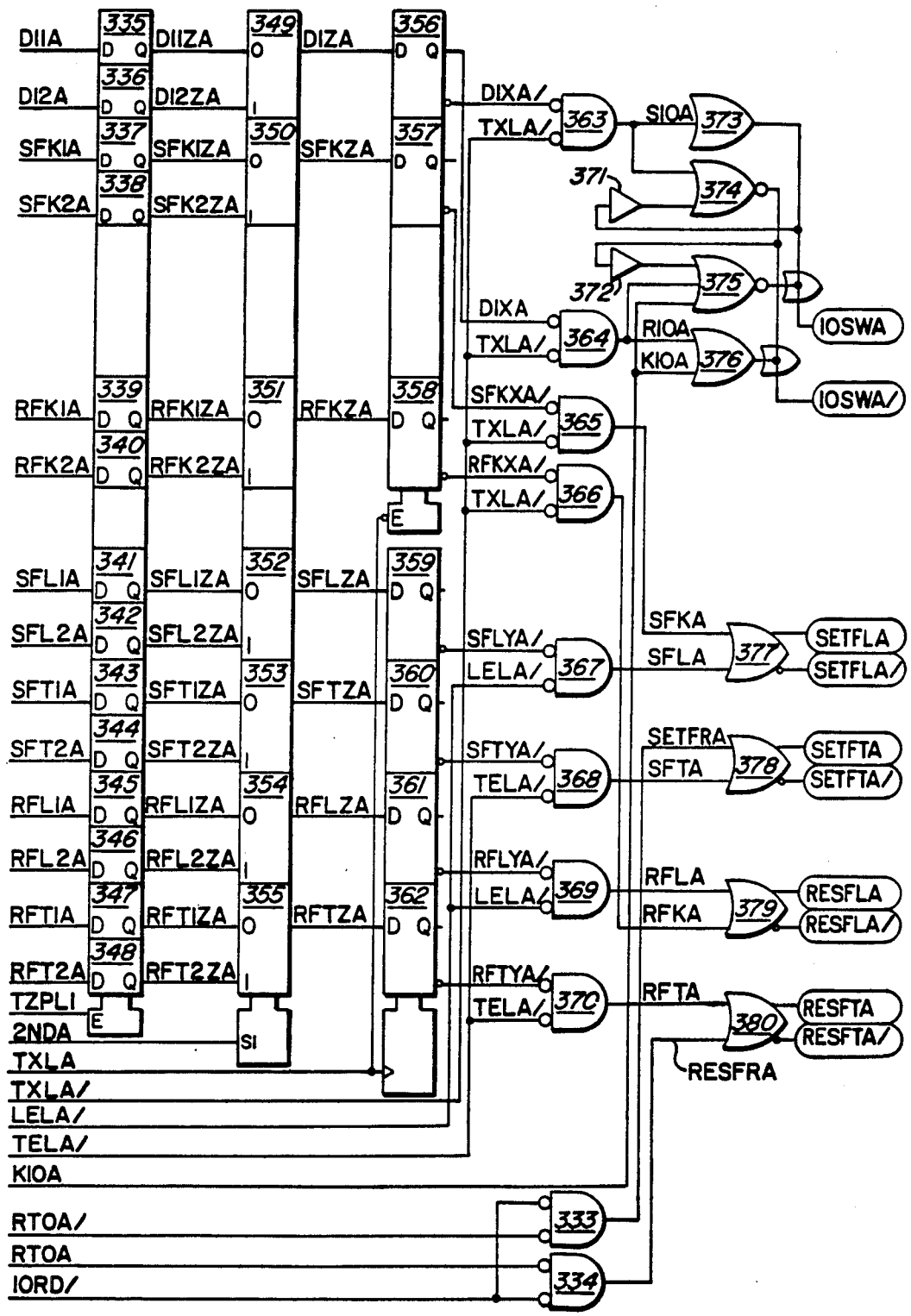
FIG._81.

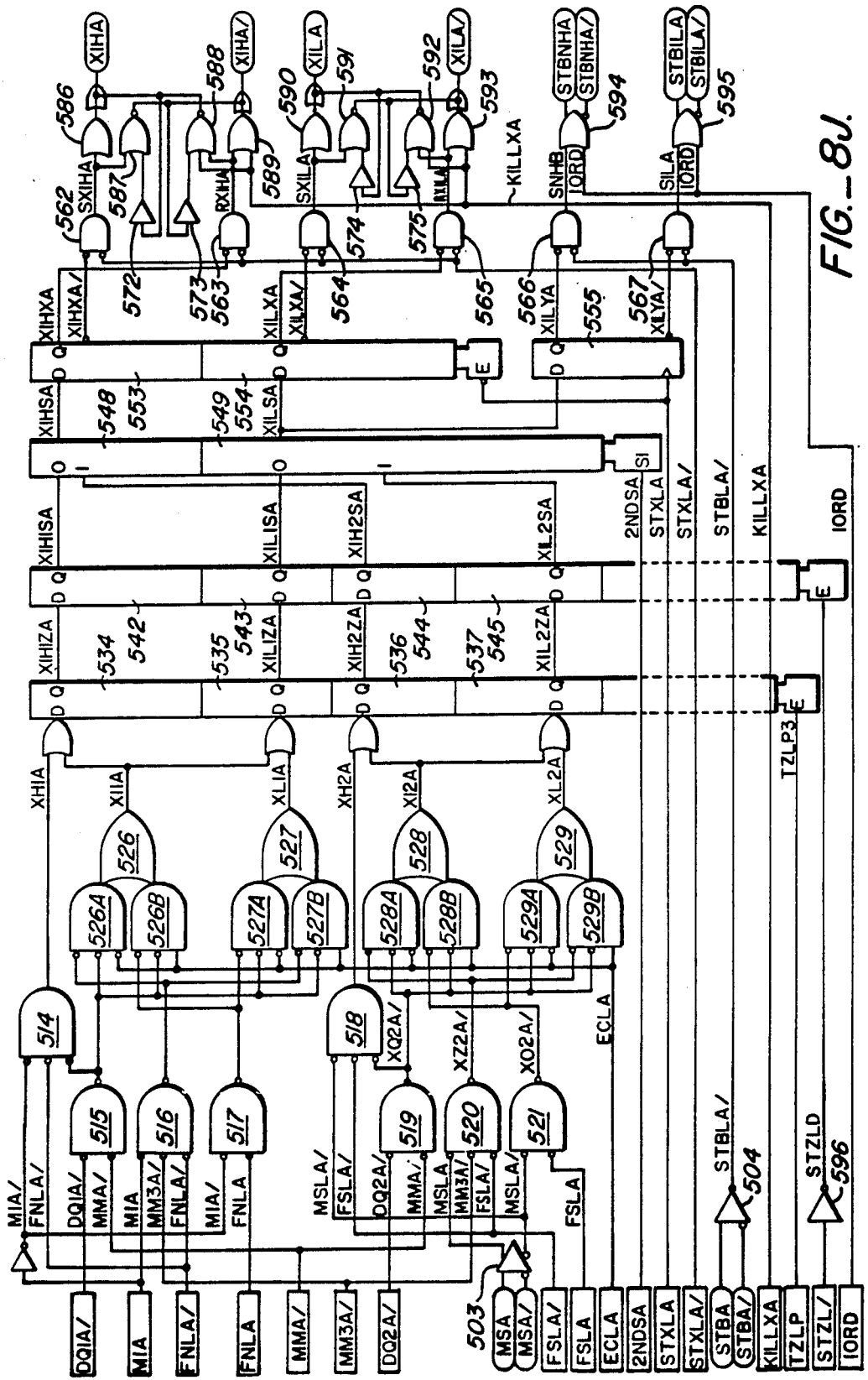

(A)

$SFK = \overline{DI} \cdot (NRZ + SBC) \cdot ECL \cdot FANT +$
$\phantom{SFK =} \overline{DI} \cdot RTO \phantom{(NRZ + SBC) \cdot ECL} \cdot FANT +$
$\phantom{SFK =} DI \cdot RTO \phantom{(NRZ + SBC) \cdot ECL} \cdot FMOD +$
$\phantom{SFK =} DI \cdot SBC \cdot \overline{FI}$ $RFK = DI \cdot (NRZ + SBC) \cdot ECL \cdot FANT +$
$\phantom{RFK =} DI \cdot RZ \phantom{(NRZ + SBC) \cdot ECL} \cdot FANT +$
$\phantom{RFK =} DI \cdot RZ \phantom{(NRZ + SBC) \cdot ECL} \cdot FMOD +$
$\phantom{RFK =} DI \cdot SBC \cdot FI$

SET AND RESET SIGNALS GATED TO OUTPUTS WITH TX (B)

$SFL = FI \cdot DI$ $RFL = \overline{FI} \cdot DI$

SET AND RESET SIGNALS GATED TO OUTPUTS WITH LE (C)

$SFT = \overline{FI} \cdot DI \cdot (SBC + RTO)$ $RFT = FI \cdot DI \cdot SBC + DI \cdot RZ$

SET AND RESET SIGNALS GATED TO OUTPUTS WITH TE

GENERATION OF SET AND RESET PIPELINE INPUT SIGNALS SFK, RFK, SFL, RFL, SFT AND RFT. THE PIPELINE OUTPUTS ARE GATED WITH TX, LE, AND TE, RESPECTIVELY.

FIG._9.

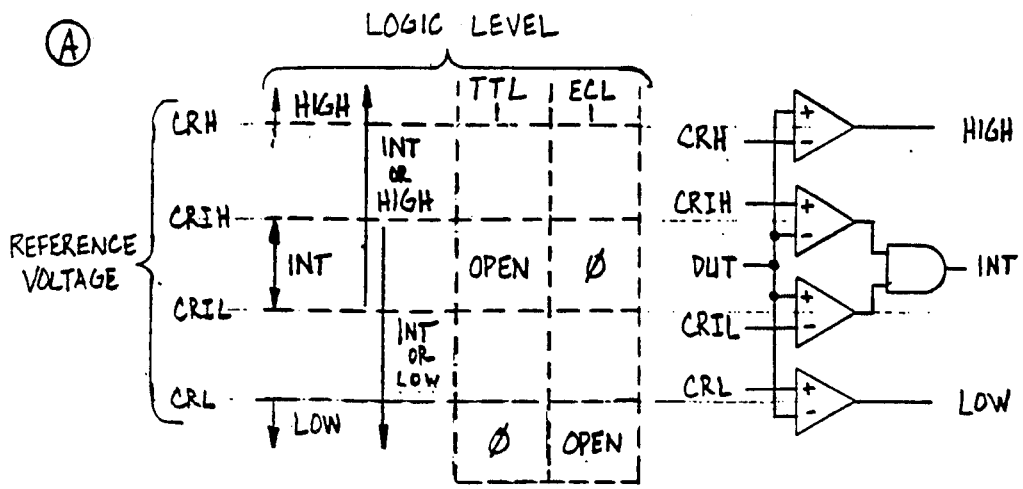
FIG.—10.

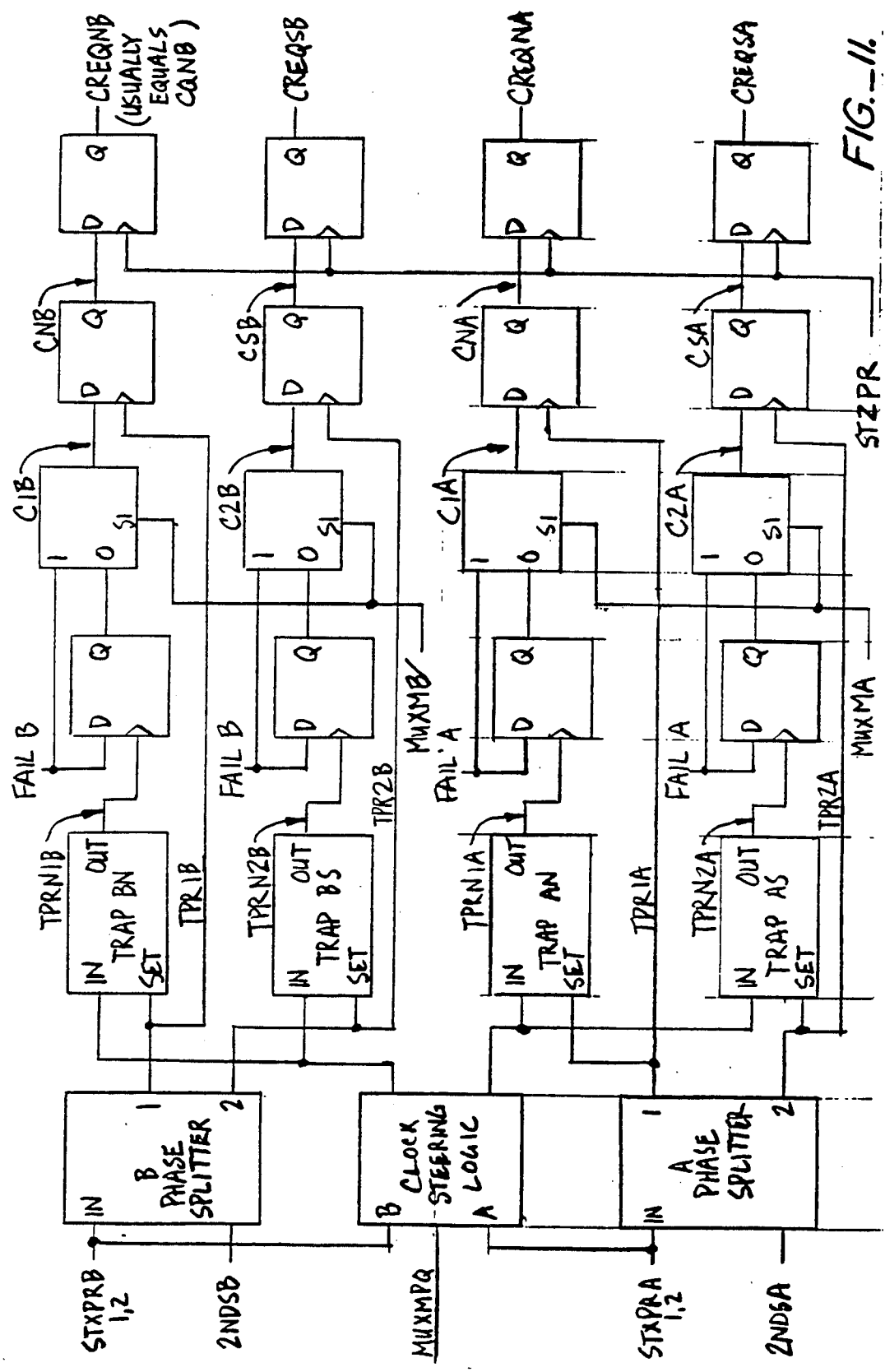
FIG._16.

FORMATTER FOR HIGH SPEED TEST SYSTEM

This application is a continuation-in-part of prior U.S. patent application Ser. No. 518,499 filed Aug. 1, 1983, and entitled "High Speed Test System," now abandoned.

This application is related to U.S. patent applications Ser. No. 611,266, entitled "Temperature Stabilized Gate"; Ser. No. 611,267, entitled "Test Period Generator for Automatic Test Equipment"; Ser. No. 611,445, entitled "Method and Apparatus for Applying and Monitoring Programmed Test Signals During Automated Testing of Electronic Circuits"; Ser. No. 611,448, entitled "Method and Apparatus for Monitoring Response Signals During Automated Testing of Electronic Circuits"; Ser. No. 611,449, entitled "Method and Apparatus for Monitoring Automated Testing of Electronic Circuits"; Ser. No. 611,451, entitled "Method and Apparatus for Dynamically Controlling the Timing of Signals in Automatic Test System"; Ser. No. 611,452, entitled "Gate Having Balanced Node"; Ser. No. 611,453, entitled "Control of signal Timing Apparatus in Automatic Test Systems Using Minimal Memory"; and Ser. No. 611,454, entitled "Multiple Stage Gate Network."

BACKGROUND OF THE INVENTION
1. Field of the Invention

This invention relates to automatic digital integrated circuit test systems and more particularly to a technique for generating signals to control the sequence of timing pulses and data to and from a device under test, and to decode error signals generated by incorrect device under test outputs.

2. Description of the Prior Art

For the testing of high speed digital integrated circuits, a typical automatic test system will contain a test vector memory that stores patterns that are to be applied to the input pins of the device under test ("DUT"), and data that is expected at the output pins of the DUT. DUT error data that is produced during a test may be stored in an error logging or compare memory. A typical automatic test system must be capable of testing devices having over 100 pins, with each pin requiring circuitry to control the application of timed data pulses to the DUT inputs, circuitry to generate strobe signals to control comparators connected to DUT outputs, and circuitry to decode error signals produced by the comparators in response to incorrect DUT outputs. The generation of the control signals and strobes must be accomplished with high timing accuracy in order to insure valid test results for high speed devices, even though these signals must travel over multiple signal paths with different propagation delays.

Under typical test conditions, it will be required to control the application of multiple timed data pulses to the DUT inputs in a single test clock cycle, and to generate multiple strobe signals. In addition, it is desirable to allow these signals to cross over the boundary of a test clock cycle and still have the error signal decoding circuitry be able to determine which test vector corresponds to which error signal. This must be done while maintaining full timing accuracy, and without introducing any increase in the comparator dead time.

SUMMARY OF THE INVENTION

According to the present invention, the circuitry required to control the application of timed data pulses to the DUT inputs, the circuitry to generate strobe signals to control comparators connected to the DUT outputs, and the circuitry to decode error signals is implemented in a completely flexible, programmable architecture on a single emitter coupled logic gate array integrated circuit. Each such circuit, herein referred to as a formatter, can control two DUT pins. By implementing this circuitry, on a single integrated circuit, it is possible to overcome many of the limitations of the prior art and to be able to construct a test system capable of handling test devices having up to 256 pins.

To overcome timing accuracy problems in previous systems, the present invention is designed to route every possible critical signal path to the DUT over a separate signal line. This allows each signal path having a different propagation delay to be aligned in time by a deskewing system in order to minimize timing errors. Signals that control the driver circuits that apply data to the DUT input pins are separated into a SET signal line and a RESET signal line, due to the difference in propagation delay for the driver when driving the DUT input high versus driving it low. Similarly, the strobe signals to the comparators connected to the DUT output pins are separated into a high level strobe and a low level strobe, due to the difference in propagation delay for the comparator when comparing the DUT output to a high level reference versus a low level reference. Thus, all timing errors due to propagation delay are minimized by this technique, except crosstalk and short term drift.

The DUT input transitions and output strobes are not fixed in time with respect to the system clock, but are referenced to it. Thus, the drive data cycles and the compare data cycles are somewhat independent of the system clock, permitting them to overlap and cross test period boundaries without requiring test vectors to be changed. In one embodiment, the drive and test cycles are referenced to separate clocks which are referenced to the test period clock. This allows drive and compare to cross over one test period boundary. This scheme may be extended to a multiple phase clock referenced to the test period clock to allow crossing over more than one test period boundary.

Multiple test vectors for a test period can be programmed to occur for testing up to four subcycles per test period. The flexible architecture of the formatter circuit, incorporating a pin multiplex mode and a memory multiplex mode, allows this to occur with full tester function on all subcycles. Tester capability is not wasted when testing non-multiplexed pins, due to the capability of reallocating the tester resources.

A part of the formatter circuitry referred to as the error correlator decodes the error signals produced by incorrect DUT outputs. Using timing signals derived from the clocks used to control the drive data for DUT inputs, and the clocks used to generate strobes to control the comparators, the error correlator correctly decodes error signals and logs them in the compare memory location corresponding to the proper test vector. The error correlator also correctly decodes error signals when either pin multiplex mode, memory multiplex mode, or both have resulted in multiple subcyles in a test period.

The formatter can be programmed to correctly respond to low, high, and high impedance (open) states for both TTL devices and ECL devices. For TTL devices, the high impedance state voltage level is between logic 0 (low) and logic 1 (high). For ECL devices, the high impedance state voltage level is more negative than the logic 0 level. By providing signals to control a four level comparator in the test head, the formatter can correctly identify logic 0, logic 1, and high impedance states for TTL devices and ECL devices without having to change logic definitions in the test vector memory.

DESCRIPTION OF THE DRAWINGS

FIG. 1 shows an overall block diagram of a digital test system showing the relationship between the formatter and error correlators and other subsystems.

FIG. 2, comprised of FIGS. 2A-2K, a timing diagram showing the signals that allow drive and comparison across test period boundaries.

FIG. 3 shows the memories storing test vector information that is utilized by the formatter, and the conditions defined by the memory contents.

FIG. 4 shows the various drive data formats that can be programmed and the resulting drive signals to the DUT.

FIG. 5 is a timing diagram showing how fail signals are decoded and sent to the compare memory in normal mode.

FIG. 5 is a timing diagram showing how fail signals are decoded and sent to the normal and split compare memories when in memory multiplex mode.

FIG. 7 is a timing diagram showing how fail signals are decoded and sent to the compare memories when in pin multiplex mode.

FIGS. 8A-J are schematic diagram of the logic circuitry of the formatter gate array integrated circuit.

FIG. 9 describes the logic equations implemented by the formatter to determine output data to the DUT and expect data from the DUT.

FIG. 10, composed of FIGS. 10A-10C, shows the four level comparator used determine the DUT output logic level and the formatter logic equations that produce signals to control it.

FIG. 11 is a block diagram of the error correlator logic.

DESCRIPTION OF THE PREFERRED EMBODIMENT

FIG. 1 is a block diagram of a digital integrated test system incorporating the formatter 6 of this invention. The distributed processing unit (DPU) 1 controls the overall operation of the test system, and in particular controls the operating modes of the formatter via registers in the formatter which can be programmed by the DPU.

The formatter receives timing signals from the timing subsystem 3 which are used to control the timing of data flow to and from the device under test 11 which has been connected to the test head 10. The timed data pulses to the DUT are first deskewed by the deskew elements 7 which independently deskew all signal paths from the timing subsystem to the DUT. The deskew elements are described in copending U.S. patent application Ser. No. 611,451, entitled "Method and Apparatus for Dynamically Controlling the Timing of Signals in Automatic Test Systems" assigned to the same assignee as this application. The timed data pulses are then directed by the test head drivers 9 to the appropriate test head and DUT pin.

The test vector generator 2 contains the information required to apply a desired sequence of data signals to the DUT input pins and the data which is expected at the DUT output pins. Any differences between the expected and actual DUT outputs are interpreted by the error correlator portion of the formatter and are logged in the compare memory 4. Diagnostic circuitry 8 and a system timing calibration subsystem 5 are included to insure that the test system is functioning to required specifications.

The sequence of the timing signals from the timing subsystem is critical to the operation of the formatter. FIG. 2 shows the timing signals supplied by the timing subsystem and their interrelationships. System time zero (TZ) (FIG. 2A) is the overall system clock to which all other timing signals are referenced. The rate at which TZ pulses occur defines the test period, and is programmable by test system software up to a maximum rate of 50 mHz. All drive data for the DUT input pins and data expected at the DUT output pins is clocked from the test vector memory into latches in the formatter at time TZ. Strobe time zero (STZ) (FIG. 2B) occurs approximately 10 ns after TZ, because 10 ns is approximately the round trip propagation delay between the test head and the DUT. It is used to clock pipeline circuitry in the formatter that changes expect data, thereby eliminating the propagation delay between the test head and DUT as a source of comparator dead time. STZPR (FIG. 2C) occurs 64 ns after STZ, which is the round trip propagation delay between the formatter and the test head. It is used by the formatter to clock DUT failure signals into the compare memory.

The signals that drive the DUT input pins are referenced to signal TX (FIG. 2D). In certain operating modes of the formatter, more than one TX pulse can occur per test period. The period between TX pulses defines a test subcycle. TX is programmable to occur a certain delay after TZ on a subcycle by subcycle basis. It always occurs after TZ and before TZ of the next test period. Following TX, there are two pulses which must not occur after TX of the next subcycle, leading edge (LE) (FIG. 2F) and trailing edge (TE) (FIG. 2G). These define the period during which drive data specified by the current test vector is applied to the DUT. By using such a two phase clocking scheme, referencing LE and TE to TX, which is referenced to TZ, the drive data may cross a test period boundary. This is shown in (FIGS. 2E-2G) where an early TX cause LE and TE to occur before the next TZ and a late TX (FIGS. 2E-G) where drive data (FIG. 2H) crosses the test period boundary.

Signals that control the comparators at the test head are referenced to STX (FIG. 2I). STX occurs approximately 10 ns after TX to minimize comparator dead time. Expect data to the comparators changes at time STX. The strobe signal STB (FIG. 2J) is a pulse of programmable duration that occurs at a programmed time after STX and before the STX of the next subcycle. Any difference between expect data and DUT output data during STB will cause a fail signal to be clocked true on the falling edge of STB. STXPR (FIG. 2K) occurs approximately 64 ns after STX and will clock fail signals from the test head into latches in the error correlator. TZ, STZ, STX and STB form a three phase clocking scheme for comparing expect data with DUT output data. By using such a three phase clocking scheme, the comparator cycle can cross a test period boundary. By extending this to more phases, for example, by having STB referenced to another signal $STX_2$, referenced to $STX_1$, referenced to STZ, the comparator cycle can cross two test period boundaries. This scheme can be extended to any number of phases, greatly increasing the period of time over which the comparator cycle can extend.

The formatter requires 3 bits of memory per pin to completely define whether during each subcycle, the DUT pin will be an input pin driven to either a 0 or 1 level, or an output pin. If it will be an output pin, the output state will be irrelevant (don't care) or it will be expected to be either a 0, 1 or open state. If the DUT output state does not agree with the expected output, the error will be detected and logged in compare memory. Referring to FIG. 3, there are three normal memories: DN, MN, and FN. If the system using the formatter will be equipped to implement a split pin mode or a memory multiplex mode, these normal memories are duplicated and referred to as the split memories: DS, MS, and FS. The F memory contains drive or expect data for each test subcycle. It is a deep memory because under normal testing situations drive and expect data are typically changing every subcycle. The D and M memories determine whether the DUT pin is an input pin or an output pin and whether to ignore errors. They are not deep memories because, typically, fewer combinations are required. The table at the bottom of FIG. 3 shows the exact definitions for each state of the D, M and F memories.

For further flexibility in testing in cases where more D and/or M memory is required, and to minimize memory costs, memory resources may be real-located from the F memory of an unused pin to the D or M memories of another pin. This is controlled by the operating mode registers in the formatter.

The operating modes of the formatter are controlled by registers that are loaded by the DPU. Each formatter gate array controls two DUT pins. When operating independently on two separate DUT pins, they have identical capabilities. In certain operating modes, the test capabilities of one pin (the slave pin, herein referred to as pin B) may be combined with the capabilities of a second pin, (the master pin, herein referred to as pin A) to provide for increased testing capabilities by pin A. This reduces the number of test pins available while increasing the testing capabilities at pin A. The mode which utilizes this feature of the formatter is termed the pin multiplex mode. In another mode, termed the split pin mode, the drive capabilities of the formatter may be separated from the comparison capabilities thereby permitting a single formatter channel to drive one DUT pin and at the same time make comparisons at a separate independent DUT pin.

To utilize the split pin mode, the memory subsystem must be equipped with both normal and split memory. Split memory generates the test vector for the DUT input pin that is being driven, while normal memory generates the expect data for the DUT pin whose output is being checked for errors.

In pin multiplex mode, the capabilities of pin B are combined with those of pin A to provide for two test subcycles per test period at pin A. This yields an effective testing rate of up to 100 MHz, depending on the programmed rate of TZ. The first subcycle will be controlled by the normal pin A memory and the second subcycle will be controlled by the normal pin B memory. Split memory is not required.

In memory multiplex mode, the normal and split memories are used by the same tester pin to generate two subcycles per test period. The normal memory controls the first subcycle and split memory controls the second subcycle. Pin multiplex mode may be combined with memory multiplex mode to allow full test capability for up to four subcycles per test period. When there are four subcycles, normal A memory controls the first subcycle of the test period, $A_1$. Split A memory controls subcycle $A_2$, normal B memory controls subcycle $B_1$ and split B memory controls subcycle $B_2$. Rules for subcycle order are that the first subcycle is $A_1$ and that subcycle $B_1$ precedes subcycle $B_2$. Any subcycle order that obeys these rules can be programmed by the DPU. Similar rules apply when there are only two or three subcycles per test period.

The DPU programs the formatter for the desired operating mode by storing defined values into operating mode registers in the formatter. Pin A has a 19 bit operating mode register and Pin B has a 14 bit operating mode register. The bit definitions are listed in Table 1 below.

TABLE 1

| CONFIGURATION REGISTER BIT DEFINITIONS | | | |
|---|---|---|---|
| Register Reference Number on Sheet 1 of FIG. 4 | | | |
| A | B | Signal Name(s) | Function |
| 148 | 147 | FD00A, FD00B | DEFINES STANDARD FORMAT FOR |
| 146 | 145 | FD01A, FD01B | FOR PIN A(B) |
| 144 | 143 | FD10A, FD10B | DEFINES ALTERNATE FORMAT |
| 142 | 141 | FD11A, FD11B | FOR PIN A(B) |
| 140 | 139 | FMODA/, FMODB/ | FORMAT MODIFY A(B) |
| 138 | 137 | FANTA/, FANTB/ | FORMAT ANTICIPATE A(B) |
| 136 | 135 | ECLA/, ECLB/ | ECL MODE FOR A(B) |
| 134 | 133 | SPLITA, SPLITB | SPLIT PIN MODE FOR A(B) |
| 132 | 131 | MUXMMA/, MUXMMB/ | MEMORY MULTIPLEX MODE FOR A(B) |
| 130 | | MUXMPI/ | PIN MULTIPLEX MODE FOR DRIVERS |
| 129 | | MUXMPQ/ | PIN MULTIPLEX MODE FOR COMPARATORS |
| 128 | 127 | FSATOMA, FSBTOMB | REPLACE MNA(B) WITH FSA(B) |
| 126 | | FSBTODA | REPLACE DNA WITH FSB |
| 125 | | FSBTOMA | REPLACE MNA WITH FSB |
| 124 | | FNBTOMA | REPLACE MNA WITH FNB |
| 123 | 122 | MMA/, MMB/ | MASTER MASK A(B) |
| 121 | 120 | MM3A/, MM3B/ | MASTER HIGH-IMPEDANCE MASK A(B) |
| 119 | 118 | DIAGA, DIAGB | DIAGNOSTIC MODE A(B) |

TABLE 1-continued

CONFIGURATION REGISTER BIT DEFINITIONS

| Register Reference Number on Sheet 1 of FIG. 4 | | | |
|---|---|---|---|
| A | B | Signal Name(s) | Function |
| 117 | 116 | DINVA, DINVB | DIAGNOSTIC INVERT MODE A(B) |

Two bits, DINVA(B) and DIAGA(B) control diagnostic modes of the formatter. Diagnostic mode DIAGA(B) will permit simultaneous drive and compare operations and is used to check the driver and comparator circuitry. Diagnostic invert DINVA(B) will logically invert the driver F data to simulate DUT errors.

Two mask bits, MM3A(B)/ and MMA(B)/ can be used to block DUT errors. MM3A(B)/ will block errors resulting from an expect open state failure and MMA(B)/ will block all failures.

Memory resource allocation is controlled by the bits FNBTOMA, FSBTOMA, FSBTODA, FSATOMA, FSBTOMB. The effect these bits have is described in Table 1.

Pin multiplex and split pin modes are selected by MUXMPQ/, MUXMPI/, MUXMMA/, MUXMB/, SPLITA, and SPLITB. Pin multiplex is selected separately for drivers and comparators so it will be compatible with split pin mode.

ECL mode is selected by ECLA/, and ECLB/. When set, these bits will correctly generate expect data so that ECL logic definitions will be used rather than normal TTL definitions.

Format anticipate and format modify, FANTA/, FANTB/, FMODA/, and FMODB/ allow proper definition of driver data when a DUT pin is being switched from an output pin to an input pin and no previous driver state is defined. The format modes define what drive data to a DUT input pin will be from time TX to LE, and from TE to the next TX. From LE to TE, drive data is always equal to the data from F memory as shown in FIG. 2H. The format modes are detailed in FIG. 4. There are six possible selections, NRZ (No Return to Zero), RZ (Return to Zero), SBZ (Surround by Zero), RTO (Return to One), SBO (Surround by One), and SBC (Surround by Complement). These modes are selected by bits in the operating mode registers as shown in Table 1. Two formats may be programmed, a standard format and an alternate format. A signal FDSEL from the DPU will select which format is being used.

Hardware Description of the Operating Mode Register

Referring to Sheet 1 of FIGS. 8A, B and C, there is shown schematically the portion of the formatter gate array that implements the operating mode registers for pins A and B. A high level applied to RRESET provides a means for initializing the A and B register banks (116-148) to a default state. To change the state of any of the registers, the proper register address is applied on address lines A$_0$ through A$_4$ which are then decoded by address decoders (114, 115). When WRITE/ is low, a negative pulse applied on ENABLE/ is gated through NOR gate (110) and enables the address decoder outputs. The address decoder outputs then enable the selected register through the dual active low enable inputs. Data for the A register bank on input DIA, or B data on input DIB is then stored in the selected register on the positive edge of the ENABLE/ pulse. For diagnostic purposes, the registers (116-148) and additionally the states of other internal signals (CREGNA, CREGNB, CREGSA, CREGSB, CLCHA, CLCHB) may be read by the distributed processing unit to verify correct operation. This is accomplished by first applying the proper register address on address lines A$_0$ through A$_4$. When WRITE/ is high, a negative pulse applied on ENABLE/ is gated through gate (112) to generate signal READ/. The output of the addressed register is then selected by the two level multiplexer (149-172) and is gated to DQA (164) and DQB (163). The distributed processing unit can read these two signals. Additionally, the register outputs are used to control logic in circuitry elsewhere in the formatter gate array. A description of these registers with definitions of each logic state is in table 1.

Referring next to FIG. 8D, there is shown schematically the portion of the formatter gate array that generates timing and control signals that are used by both the error correlator section, and the logic section that determines the time sequence of data output to a DUT pin.

There are four identical logic circuits (217ABC, 221), (218ABC, 222), (219ABC, 223), (220ABC, 224) that generate signals (KIOA, 2NDB, KILLXA, 2NDSB, KIOB, 2NDA, KILLXB, 2NDSA). These signals are used to indicate which subcycle of memory multiplex mode is about to take place or is currently taking place, to inhibit input/output and strobes for channel A when channel B is active in pin multiplex mode, and to inhibit driver signals and strobes for channel B when channel A is active in pin multiplex mode.

The generation of signals (2NDB, 2NDSB, KIOA, KILLXA) will be described. Generation of the corresponding signals (2NDA, 2NDSA, KIOB, KILLXB) is identical, but uses the timing pulses for channel A. In normal mode, with no pin multiplex or memory multiplex selected, signals (MUXMPI/, MUXMPQ/, MUXMMB/) will all be high. Thus gates (217A, 219A) will have a low output due to the low signal at the AND input. KIOA and KILLXA will be low, indicating that the IO switch for A is open and the comparator expect data for channel A is channel A normal data. If pin multiplex mode has been selected, MUXMPI will be high and the AND gate (217A) will allow the pulse TXB to pass through to output KIOA. This pulse will reset a latch in the logic that generates the driver output data for channel A indicating that a B subcycle of pin multiplex mode is taking place. Gate (218A) will similarly allow pulse STXB to pass through to output KILLXA if MUXMPQ is high. This pulse will reset a latch in the logic that generates comparator expect data for channel A indicating that a B subcycle of pin multiplex mode is taking place. Note that IORESET is wire-OR'ed to KIOA and KILLXA and a high level will over-ride any other conditions by opening the I/O switch and setting the expect data to don't care.

If memory multiplex mode has been selected by the operating mode registers, MUXMMB/ will be low. Thus, at time zero of the current cycle, timing pulse TZ will reset flip-flop (221) and 2NDB will be low. On the falling edge of TXB, the rising edge of TXB/ will clock a high level into latch (221) and 2NDB will be high. It will remain high during the remainder of the cycle until the next TZ. Similarly, at strobe time zero, timing pulse STZ will reset latch (222) and 2NDSB will be low. On the falling edge of STXB, the rising edge of STXB/ will clock a high level into latch (222) and 2NDSB will be high. It will remain high until the next STZ.

The signals (2NDA, 2NDSA, KIOB, KILLXB) are generated by identical circuitry that is driven by signals TXA, STXA and MUXMMA instead of TXB, STXB and MUXMMB. These signals are used to indicate which subcycle of memory multiplex mode is about to take place or is currently taking place, to inhibit input/output and strobes for channel B when channel A is active in pin multiplex mode, and to inhibit driver signals and strobes for channel A when channel B is active in pin multiplex mode. FIG. 2 details the timing relationships between these signals.

At the bottom FIG. 8D, gates (226-228) comprise a glitch generator that puts out a very narrow pulse that is two inverter delays wide when a pulse at TZ occurs, independent of the width of the TZ pulse. The additional logic at the bottom functions to delay the input signals for time synchronization purposes.

Generation of Output Signals for the Test Head Drivers

Referring next to FIG. 8G, there is shown schematically the portion of the circuitry of the formatter that generates timed data pulses to set and reset the outputs of the test head drivers which are connected to DUT input pins. There are three distinct time periods, at the start of which the driver outputs may either be set or reset. These periods are the period from TX to LE, from LE to TE, and from TE to the next TX. Set or reset during the period TX to LE is determined by the selected format, the setting of operating mode register bits ECL, FANT and FMOD, and by the D memory bit. Set or reset during the period from LE to TE is determined by the D and F memory bits. Set or reset during the period from TE to the next TX is determined by the selected format and the D and F memory bits.

The signal FDSEL supplied to the formatter will select either the standard format bits of the configuration register (FD00A, FD01A) or the alternate format bits (FD10A, FD11A) by controlling the select line of the multiplexer (312, 313). Gates (318-320) decode these bits to generate signals SBCA/,RTOA/,RTOA, and RZA/. These signals along with FMOD/ determine the selected format. If SBCA, RTOA, and RZA are all low, the selected format for pin A is NRZA.

The memory reallocation bits FSBTODA, M1AMUX1, and M1AMUX0 control the select inputs of multiplexers (308, 309) to select the proper D and M memory data. Multiplexers (310, 311) select either normal F data or split F data if pin A is split, and then invert it if the configuration register bit DINVA is set. The result of this logic is to have correct D, F, and M memory data and signals indicating the selected format for all subcycles at pin A ready at time TZ.

Referring to FIG. 8H, the function of gates (321A, B, C, D–324A, B, C, D) is to implement the logic equations as shown in FIG. 9A. These equations determine whether to set or reset the driver output during the period TX to LE. The signal outputs from this logic are SFK1A to set the driver output during $TX_1$ to $LE_1$, RFK1A to reset the driver output during $TX_1$ to $LE_1$, and SFK2A, RFK2A which are identical except that they apply to the period $TX_2$ to $LE_2$.

The function of gates (325-332) is to implement the logic equations as shown in FIG. 9B. These equations determine whether to set or reset the driver output during the period LE to TE, and during the period from TE to the next TX. For the period $LE_1$ to $TE_1$ the signals are SFL1A, RFL1A and for $TE_1$ to the next TX the signals are SFT1A and RFT1A. Signals SFL2A, RFL2A, SFT2A, RFT2A are identical except that they apply to the second cycle in memory multiplex mode. Referring to FIG. 8I, all of the set and reset signals for subcycles 1 and 2, and in addition, the D memory data bits DI1A and DI2A are latched in the latches (335-338) at time TZ. Thus all data required to completely define the driver outputs for all output subcycles of a test period is latched at time TZ.

The outputs of latches (335-338) are selected by multiplexers (349-355). The multiplexer selects all signals for subcycle 1 until signal 2NDA indicates the start of subcycle 2. Then the multiplexer selects all signals for subcycle 2. The multiplexer outputs DIZA, SFKZA, RFKZA are latched at time TX by latches (356-358). Multiplexer outputs SFLZA, RFLZA, SFTZA, and RFTZA are clocked in D flip flops (359-362) at the leading edge of TX. Thus, at time $TX_1$, the latch and flip flop outputs are the set and reset signals for subcycle 1 which control the test head drivers, while at time $TX_2$, the latch and flip flop outputs are the set and reset signals for subcycle 2 which control the test head drivers.

Gates (365, 366) enable the set and and reset signals for the period TX to LE at time TX, gates (367, 369) enable the signals for period LE to TE at time LE, and gates (368, 370) enable the signals for period TE to the next TX at time TE. The set pulses for periods TX to LE and LE to TE are OR'ed together by OR gate (377) and become the pulsed signal SETFLA. The reset pulses for those periods are OR'ed together by OR gate (379) to become the pulsed signal RESFLA. Set pulses for TE to the next TX, and a set pulse initiated by a reset signal IORD are OR'ed together by OR gate (378) to become the pulsed signal SETFTA. Reset pulses for TE to the next TX, and a reset pulse initiated by a reset signal IORD are OR'ed together by OR gate (380) to become the pulses signals RESFTA. Pulsed signals SETFLA, SETFTA, RESFLA, RESFTA are deskewed and sent to the test head drivers. the IO In addition, the D memory bit controls the IO switch at the test head which will determine whether to drive the DUT input pins, or to disconnect the driver and to read DUT data from a DUT output pin. The D bit is latched into a set-reset latch constructed from gates (363, 364, 371-376) and becomes the signal IOSWA which goes to the test head Formatter circuitry for pin B is functionally identical to that for pin A except for minor differences due to the fact that the only type of memory reallocation available for pin B is selected by operating mode register FSBTOMB.

Generation of Expect Data for the Comparators

When the formatter is connected to a DUT output pin, it expects that certain data will be present at the DUT output pin during the time period defined by STB. Logic circuitry generates signals that tell the comparators what logic level to expect at the DUT output pin. FIG. 8J shows schematically the circuitry that generates the expect data signals for pin A. The circuitry for pin B is identical, except for any differences that will be noted.

Expect data for each subcycle is determined by the F, D, and M memory bits and the setting of the operating mode register bits DIAG, SPLIT, MM and MM3. As shown in FIG. 10A, the comparators use a four level reference scheme to define three regions; high, low and intermediate. As shown in FIG. 10B, there are two expect signals that go to the comparators, XIH (Expect intermediate or High) and XIL (Expect intermediate or Low). The comparator reference levels and the four possible states of the two bits XIH and XIL uniquely determine the region that DUT output data is supposed to lie in.

The operating mode register bit ECLA mines whether TTL logic definitions (ECLA=∅) or ECL logic definitions (ECLA=1) will be used. For TTL, logic ∅ is low, logic 1 is high, and the open state is intermediate. For ECL, logic ∅ is intermediate, logic 1 is high and the open state is low.

At time TZ, D, F, and M memory data and operating mode register outputs DIAG, SPLIT, MM and MM3 are decoded to generate the signals XH1A, XI1A, XL1A for subcycle 1 and corresponding signals for subcycle 2. Gates (514–521, 526–529) implement the logic equations as shown in FIG. 10C to generate these signals. XH is expect high, XI is expect intermediate and XL is expect low. XH1A is OR'ed with XI1A and latched in latch (534) at time TZ. XI1A is OR'ed with XL1A and latched in latch (535) at time TZ. The corresponding operations occur for subcycle 2 signals which are latched in latches (536, 537). Thus at time TZ, all expect data for all subcycles of a test period are latched. These latches form the first stage of a pipeline that will minimize comparator dead time. At time STZ, the first pipeline stage outputs are latched into the second pipeline stage consisting of latches (542–545). Thus, new expect data for the next test period can change before results at the DUT outputs have propagated back to the formatter, eliminating this source of dead time. data Multiplexers (548, 549) select expect for subcycle 1 during subcycle 1 when 2NDSA is low, and expect data for subcycle 2 during subcycle 2 when 2NDSA is high. The expect data signals pass through the latches (553, 554) and are gated by STX through gates (562–564) to be latched in the two set-reset latches constructed from gates (572–575, 586–593). Thus, expect data is latched for the compare subcycle and signals XIHA, XILA and their complements are sent to the comparators. In addition, on the leading edge of pulse STX, edge triggered D flip flop (555) stores signal XILSA which then gates the STB pulse to STBNHA through gates (566, 594) if XILSA was low, or through gates (567, 595) to STBILA if XILSA was high.

The separate outputs STBNHA and STBILA allow the deskew element for the strobe to correspond to the propagation delay of the comparator that is used during that particular cycle, minimizing strobe timing errors. These signals and their complements are the strobe signals sent to the comparators through deskew elements and test head drivers. The comparators then compare expect data with DUT output data during the strobe period and generate a failure signal if there is a difference

The Error Correlator

The error correlator receives DUT failure signals from the comparators at the test head and timing signals from the timing generator subsystem. It decodes the failure signals and generates data for the compare memory in the proper sequence for any multiplex mode of operation. The compare memory data is then clocked synchronously out of the formatter at time STZPR.

Referring to FIG. 8D, failure signals from either test head 1 or test head 2 are decoded by logic (214, 215) to generate the composite failure signals FAIL A and FAIL B. The test head comparators at each test head return two failure signals, FAIL J and FAIL K. When pin multiplex mode is not enabled, J failures are pin A failures and K failures are pin B failures. In pin multiplex mode, there are no K failures because the comparison capabilities of pin B are combined with those of pin A. Thus, J failures are routed to both FAIL A and FAIL B.

FIG. 11 is a block diagram of the error correlator circuitry that is shown schematically in FIGS. 8E and 8F, consisting of gates (236–293). As shown in FIG. 11, the error correlator consists of a phase splitter circuit, followed by trap circuitry, and a three stage pipeline register with multiplexing after the first stage. The output signals from the error correlator are data that will be stored in normal and split A and B compare memories.

The function of the phase splitter is to take STXPR pulses and gate the first one that occurs in the test period to signal TPR1 and the second to signal TPR2. The function of the trap is to be enabled by the appropriate STXPR of the test period, and allow only the next STXPR to be gated through to clock the registers of the first pipeline stage.

The multiplexer (236,237) of FIG. 8E will allow the appropriate STXPR signal to reach the inputs of the trap circuitry where they will be gated to the trap outputs if the trap was previously set. When there is no pin multiplex mode, only STXPRA will reach the trap inputs of pin A and only STXPRB will reach the trap input of pin B. In pin multiplex mode, both STXPRA and STXPRB go to both the pin A and pin B trap inputs.

Normal Mode Operation

In normal mode, neither pin multiplex mode or memory multiplex mode are enabled. Thus, pin A and pin B operate independently on only one failure signal per test period. Failure signals are latched by the corresponding STXPR (pin-oriented) timing signal. The resulting data are then pipelined by the STZPR (system-oriented) timing signal. All compare memory inputs are therefore independent of pin timing and synchronous with system timing. Referring to of FIG. 8E, D register (263) remains reset by MUXMMA/ applied to the reset input, and thus low output Q enables TPRA/ through NAND gate (264) to become TPR1A. No TPRA/ signals get gated through NAND gate (265) and thus the phase splitter (263–265) is effectively disabled. The outputs of the first stage pipeline register (271) are ignored because multiplexer (276) selects the FAIL A signal directly through the 1 input Thus only a two stage pipeline consisting of registers (276) and (282) is used in normal mode. FIG. 5 details the timing during a normal mode test period.

The test period starts at time STZ, and an STX pulse must occur before the next STZ. Failure data is latched on the falling edge of STB which occurs after STX and before the next STX, but can overlap the test period boundary defined by STZ. For example, the STB for $STX_2$ occurs after $STZ_3$ in FIG. 5, but before $STX_3$. The time it takes for strobe signals to propagate from the formatter to the comparators at the test head plus the time it takes for failure signals at the test head to propagate back to the error correlator circuitry in the formatter is the strobe round trip delay. This delay of approximately 64 ns causes the failure signals to occur later than the corresponding strobes, as indicated in FIG. 5. This can be seen under the dashed line on FIG. 5 where FAIL A changes one strobe round trip delay after the falling edge of STB. Since an STX must occur before the next falling edge of STB, STXPR, which occurs one strobe round trip delay after STX can be used to clock FAIL A into register (280) to become signal CNA. STZ must occur before the next STX, so STZPR, which occurs one strobe round trip delay delay time after STZ, can clock the data out of register (280) into register (282) of FIG. 8F, the pipeline output. Logic (284) gates CREGNA out to CQNA if it is not masked (MMA/ is low) and DIR is not set. Thus, failure signals are available to the compare memories synchronous with STZPR and delayed by two test periods plus one strobe round trip delay plus one TZ to STZ delay time from the TZ of the test vector associated with the DUT failure.

Memory Multiplex Mode Operation

In memory multiplex mode, pins A and B are still completely independent, thus failure signals on FAIL A and FAIL B are independent and timing signals are independent. Circuit operation for pin A will be described, pin B operation is identical.

In this mode, the phase splitter and the trap circuitry are both utilized, and the pin multiplex selection logic still gates only STXPRA's to the pin A error correlator. Referring to FIG. 8E, the start of the compare data test period, the STXPR pulse resets D latch (263) of the phase splitter causing signal 2NDPRA to be low. When the first STXPRA pulse occurs, it is gated through NAND gate (264) to become pulse TPR1A. At the end of this pulse, a high level is clocked into latch (263) causing signal 2NDSA to go high. Thus, the second STXPRA pulse of the test period is gated through NAND gate 265 to become pulse TPR2A. Pulse TPR1A sets the normal trap latch (266) and thus allows NAND gate (270) to gate the next STXPR pulse through to become pulse TPRN1A. The next pulse is fed back to reset trap latch (266). Thus, only the next STXPR pulse after the first STXPR pulse of a test period is gated through to become pulse TPRN1A. The split trap, consisting of gates (267, 270) functions in a similar manner, but offset later in time by one STXPR pulse due to the phase splitter action of gates (263–265). Thus, only the next STXPR pulse after the second STXPR pulse of a test period is gated through to become pulse TPRN2A. Since there are exactly two STXPR pulses per test period in memory multiplex mode, TPRN2A is actually the first STXPR pulse of the next test period. These signals can be seen in FIG. 6, the timing diagram for memory multiplex mode.

Referring to FIG. 6, and FIG. 8E, the failure data for subcycle 1.1 is available one strobe round trip delay after the falling edge of STB 1.1. Thus the rising edge of TPRN1A can clock the data into register 271 to become signal C1A. Similarly, TPRN2A will clock failure data for subcycle 1.2 into register 272 to become signal C2A. The first stage pipeline has thus separated all subcycle 1 failures from subcycle 2 failures. Subcycle 1 failures are subsequently directed to the normal compare memory and subcycle 2 failures are directed to the split compare memory.

The rising edge of TPRN1A which occurs one strobe round trip delay after STXA 2.2 clocks the data C1A into the second stage of the normal pipeline register 280. Similarly, TPRN2A clocks C2A into the second stage of the split pipeline register 281. The failure signals are now guaranteed to be valid when the STZPR occurs. STZPR 3, which occurs one stobe round trip delay after STZ 3, clocks the failure signals into the third pipeline stage consisting of normal register 282 and split register 283. The failure outputs, CREGNA and CREGSA are thus output synchronously with STZPR, delayed by two test periods plus one strobe round trip delay plus one TZ to STZ delay time from the TZ of the test vector associated with the DUT failure.

Pin Multiplex Mode Operation

Error correlator operation during pin multiplex mode operation is similar to that for memory multiplex operation in that the trap and a three stage pipeline is used. However, in place of a phase splitter to separate out STXPRA1 and STXPRA2, the pin multiplex selection logic is used to direct both STXPRA and STXPRB to both the pin A an pin B normal error correlators.

The pin multiplex selection logic will select the ∅ inputs of 236, 237 since MUXMPQ/ will be low when pin multiplex mode is enabled. Thus all STXPR's will be gated by the OR gates at the inputs to 236, 237 to the outputs TPRCA/ and TPRCB/. The trap for pin A will be set by STXPRA and thus allow STXPRB to be gated through to become TPRN1A. The trap for pin B will be set by STXPRB and thus allow STXPRA of the next test period to be gated through to become TPRN1B. After this stage, the clocking of the pipeline registers is identical to memory multiplex operation for the error correlator circuitry for the normal compare memory. FIG. 7 details the timing for pin multiplex mode. Both A and B failure signals enter the first pipeline stage of the error correlator circuitry for pin A and pin B. The trap circuitry, functioning as for memory multiplex mode, allows the error correlator to separate subcycle 1 failures from subcycle 2 failures at the output of the first pipeline stage. The second pipeline stage further aligns the pipeline outputs in time, and guarantees that the failure signals will be valid during the next STZPR pulse. Finally, the third stage outputs are clocked by STZPR and thus subcycle 1 and subcycle 2 errors have been separated, with subcycle 1 errors being directed to the pin A normal compare memory and subcycle 2 errors being directed to pin B normal compare memory, synchronous with STZPR and delayed by two test periods plus one strobe round trip delay plus one TZ to STZ delay time from the TZ of the test vector associated with the DUT failure.

Combined Pin and Memory Multiplex Mode

When both pin multiplex mode and memory multiplex mode are enabled, the pin multiplex selection logic, phase splitters, traps, and three stage pipeline are all used. Referring to FIG. 8E, the first STXPRA of a test period sets the pin A normal trap (266, 269). The second STXPRA sets the pin A split trap (267, 270). The first STXPRB sets the pin B normal trap (241, 244) and the second STXPRB sets the pin B split trap (242, 245). Since the failure signal for the previous subcycle is valid when the next STXPR occurs, the correct failure data is latched into the four first stage pipeline registers (246, 247, 271, 272) when the STXPR pulse following the one which set the trap occurs. Thus, the first stage pipeline outputs C1A, C2A, C1B, C2B have the correct failure data. C1A has failure data for the first memory multiplex cycle for pin A, C2A has the data for the second memory multiplex cycle of pin A, and likewise for C1B and C2B. The second and third pipeline stages are clocked by STXPR'S, and STZPR respectively. The result is correct failure data appearing at outputs CQNA, CQSA, CQNB, CQSB synchronous with STZPR and delayed by two test periods plus one strobe round trip delay plus one TZ to STZ delay time from the TZ of the test vector associated with the DUT failure.

Summarizing the error correlator operation, expect data from the normal and split memories for pins A and B has been compared with DUT output data by the comparators at the test head and failure signals have been directed to the appropriate compare memory. The error correlator can correctly handle failure signals for up to four compare subcycles per test period and allow for compare across test period boundaries. By extending the two phase clocking scheme of STB referenced to STX referenced to STZ to more phases, compare across multiple test period boundaries could be implemented.

Match Mode

There is an additional operating mode of the formatter that is controlled by the external signal DIR. In this mode, the results of a test cycle are used to control the source address of the next test vector. In this mode, the normal error correlator pipeline circuitry is bypassed and sent directly to the CQNA and CQNB outputs when DIR is high. This mode is useful for synchronizing the test system with the circuitry in the DUT when first starting a test sequence. In this case, failure information does not need to be routed to the proper compare memory location, and any failure signal indicates that the match has failed.

I claim:
1. In an automatic test system for the testing of an integrated circuit in a test head, the system controlled by a data processing unit and including a timing subsystem for providing timing signals including a cyclical test period clock signal, signal, a formatting circuit comprising:
   operating mode register means coupled to the data processing unit for storing data received therefrom indicative of a test to be performed;
   test head controller means coupled to the operating mode register means add to the timing subsytem for controlling the test head in response to the state of the operating mode register means, the test head controller means including means for supplying stimuli signals to the test head during at least test period cycle subsequent to the test period cycle from which the stimuli signals originated; and
   error correlator means coupled to receive the timing signals from the timing subsystem, coupled to the register means and coupled to receive response signals from the test head, the error correlator means for associating the response signals with the test period from which the stimuli signals originated.

2. Apparatus as in claim 1, wherein the means for supplying stimuli signals to the test head during a test period cycle subsequent to the test period cycle further comprises means for supplying stimuli signals to the test head during the test period cycle from which the stimuli signal originated.

3. Apparatus as in claim 1 wherein the test head comprises:
   driver means switchably connectable to the integrated circuit for applying stimuli signals to input nodes of the integrated circuit; and
   comparator means switchably connectable to the integrated circuit for receiving response signals from the output nodes of the integrated circuit.

4. Apparatus as in claim 3 wherein the test head controller means controls both the driver means and the comparator means.

5. Apparatus as in claim 4 wherein the register means comprises:
   driver format register means for storing data indicative of a format of a stimuli signal to be supplied by the driver means; and
   comparator format register means for storing data indicative of a format of a response signal to be received by the comparator means.

6. Apparatus as in claim 5 wherein the register means further comprises resource allocation means for storing data indicative of the driver and comparator means to be coupled to a node of the integrated circuit.

7. Apparatus as in claim 1 wherein the timing subsystem further supplies to the formatting circuit a test subcycle clock occurring at least one per test period and a leading edge signal to define the time at which a stimuli signal is to be applied to the integrated circuit.

8. Apparatus as in claim 5 further comprising test vector generating means, coupled to the test head controller means, for storing data to be used in the testing of the integrated circuit.

9. Apparatus as in claim 6 wherein the test vector generating means stores data for each node of the integrated circuit comprising:
   definintion data to specify which of the driver means or comparator means will be coupled to said node of the integrated circuit;
   mask data to specify whether errors detected at said node are to be ignored or not; and
   test data for said node.

10. Apparatus as in claim 9 wherein the test head controller means further comprises pin multiplexing means responsive to the test vector generating means for combining the data stored in the test vector generating means for two different nodes and using the combined data for a single node.

11. Apparatus as in claim 10 wherein the test head controller means further comprises split pin means for dividing the data stored in the test vector generating means for a single node and using a first part of the data for a first node and a second part of the data for a second node.

12. Apparatus as in claim 11 wherein the test head controller means further comprises reassignment means for dividing the data stored in the test vector generating means for each of two nodes and using some of the data stored for each node on the first node and some of the data stored for each node on the second node.

* * * * *